(12) United States Patent
Mizuta

(10) Patent No.: US 7,999,975 B2
(45) Date of Patent: Aug. 16, 2011

(54) ANALOG FRONT-END CIRCUIT AND ELECTRONIC INSTRUMENT

(75) Inventor: Masahiko Mizuta, Sapporo (JP)

(73) Assignee: Seiko Epson Corporation, Tokyo (JP)

( * ) Notice: Subject to any disclaimer, the term of this patent is extended or adjusted under 35 U.S.C. 154(b) by 648 days.

(21) Appl. No.: 12/149,780

(22) Filed: May 8, 2008

(65) Prior Publication Data

US 2008/0291506 A1 Nov. 27, 2008

(30) Foreign Application Priority Data

May 22, 2007 (JP) ................. 2007-135721

(51) Int. Cl.
*H04N 1/40* (2006.01)
*H04N 1/46* (2006.01)

(52) U.S. Cl. ....... 358/466; 358/3.24; 358/465; 358/519; 358/530

(58) Field of Classification Search .................. 358/1.9, 358/406, 461, 465, 466, 504, 516, 519, 520, 358/523, 530, 3.24

See application file for complete search history.

(56) References Cited

U.S. PATENT DOCUMENTS

| 5,038,225 | A | * | 8/1991 | Maeshima | 358/461 |
| 6,249,615 | B1 | * | 6/2001 | Kunishige | 382/274 |
| 7,006,065 | B1 | * | 2/2006 | Sugawara et al. | 345/89 |
| 2003/0072497 | A1 | * | 4/2003 | Hiromatsu | 382/274 |
| 2007/0127046 | A1 | * | 6/2007 | Soeda | 358/1.9 |
| 2008/0204297 | A1 | | 8/2008 | Mizuta | |

FOREIGN PATENT DOCUMENTS

| JP | A-2000-278495 | 10/2000 |
| JP | A-2001-203891 | 7/2001 |
| JP | A-2001-268364 | 9/2001 |
| JP | A-2004-297146 | 10/2004 |
| JP | A-2006-186606 | 7/2006 |
| JP | A-2006-217205 | 8/2006 |

OTHER PUBLICATIONS

New U.S. Patent Application filed May 8, 2008. In the name of Masahiko Mizuta.

* cited by examiner

*Primary Examiner* — James A Thompson
(74) *Attorney, Agent, or Firm* — Oliff & Berridge, PLC

(57) ABSTRACT

An analog front-end circuit includes an analog processing circuit, an A/D converter, a calculation circuit, and a target register in which a black level target value is set. The analog processing circuit includes a clamp circuit that performs a line clamp operation, and an offset adjustment circuit. The calculation circuit monitors an A/D-converted value of a black reference pixel after the line clamp operation in a black level monitor period after a line clamp period but before an effective pixel output period, and performs a black level error correction process by writing an offset adjustment value that causes the A/D-converted value to be set at the black level target value into the offset adjustment register.

13 Claims, 16 Drawing Sheets

FIG. 11A

| A/D-CONVERTED VALUE | 0×40 |
|---|---|
| BLACK TARGET VALUE | 0×20 |
| DIFFERENTIAL VALUE | 0×40−0×20=0×20 |
| CORRECTION AMOUNT A | 8 |
| ADJUSTMENT AMOUNT B | 1 |

FIG. 11B

| FIRST PROCESS | 0×20−8=0×18 |
|---|---|
| SECOND PROCESS | 0×18−8=0×10 |
| THIRD PROCESS | 0×10−8=0×08 |
| FOURTH PROCESS | 0×08−8=0×00 |

FIG. 12

| GAIN G | CORRECTION AMOUNT A | ADJUSTMENT AMOUNT B |
|---|---|---|
| 16 | $8(=\frac{VF \times G \times (2^k-1)}{ADR})$ | 1 |
| 8 | 4 | 1 |
| 4 | 2 | 1 |
| 2 | 1 | 1 |
| 1 | 1 | $2(=\frac{ADR}{VF \times G \times (2^k-1)})$ |
| 0.5 | 1 | 4 |
| 0.25 | 1 | 8 |

FIRST DETECTION LINE COUNT SETTING MODE

SECOND DETECTION LINE COUNT SETTING MODE and Electronic Instrument

ANALOG FRONT-END CIRCUIT AND ELECTRONIC INSTRUMENT

Japanese Patent Application No. 2007-135721 filed on May 22, 2007, is hereby incorporated by reference in its entirety.

BACKGROUND OF THE INVENTION

The present invention relates to an analog front-end circuit, an electronic instrument, and the like.

An image sensor (e.g., CCD or CMOS sensor) used for electronic instruments (e.g., image reader) is configured so that an analog image signal relating to a document or the like read by the image sensor is converted into a digital image data using an A/D converter. JP-A-2004-297146 discloses technology relating to an analog front-end circuit (image processor) having an A/D converter.

The analog image signal output from the image sensor contains a DC offset component. The voltage level of the image signal may exceed the input allowable range of the analog front-end circuit due to the DC offset component. Therefore, in order to remove the DC offset component to set the voltage level of the image signal at an appropriate level, it is desirable to provide an AC coupling capacitor between the output of the image sensor and the input of the analog front-end circuit and provide a clamp circuit in the analog front-end circuit.

The clamp operation of the clamp circuit is classified into a bit clamp operation and a line clamp operation. The bit clamp operation is used for correlated double sampling and the like. The bit clamp operation is not suitable for applications which require high-speed A/D conversion. The line clamp operation is suitable for applications (e.g., office instruments) which require high-speed A/D conversion. However, when an error of a black level drawn toward a clamp level has occurred, accurate A/D conversion cannot be implemented when a sudden change in density of a document or the like has occurred.

SUMMARY

According to one aspect of the invention, there is provided an analog front-end circuit comprising:

an analog processing circuit that receives an analog input image signal from an image sensor, performs a given process on the input image signal, and outputs an analog image signal;

an A/D converter that A/D-converts the analog image signal input from the analog processing circuit;

a target register, a black level target value being set in the target register; and a calculation circuit that monitors an A/D-converted value output from the A/D converter and performs calculations, the analog processing circuit including:

a clamp circuit that performs a line clamp operation on the input image signal from the image sensor; and an offset adjustment circuit that includes an offset adjustment register and performs an offset adjustment on an image signal based on an offset adjustment value set in the offset adjustment register, the calculation circuit monitoring the A/D-converted value of a black reference pixel after the line clamp operation in a black level monitor period, the black level monitor period being a period after a line clamp period of the clamp circuit but before an effective pixel output period, and performing a black level error correction process relating to the line clamp operation by writing an offset adjustment value into the offset adjustment register, the offset adjustment value causing the A/D-converted value to be set at the black level target value set in the target register.

According to another aspect of the invention, there is provided an electronic instrument comprising:

the above analog front-end circuit; and an image sensor.

BRIEF DESCRIPTION OF THE SEVERAL VIEWS OF THE DRAWING

FIGS. 11A and 11B are views illustrative of an operation according to one embodiment of the invention.

FIG. 12 is a view illustrative of a method of setting a correction amount and an adjustment amount.

DETAILED DESCRIPTION OF THE EMBODIMENT

Figure 1A:
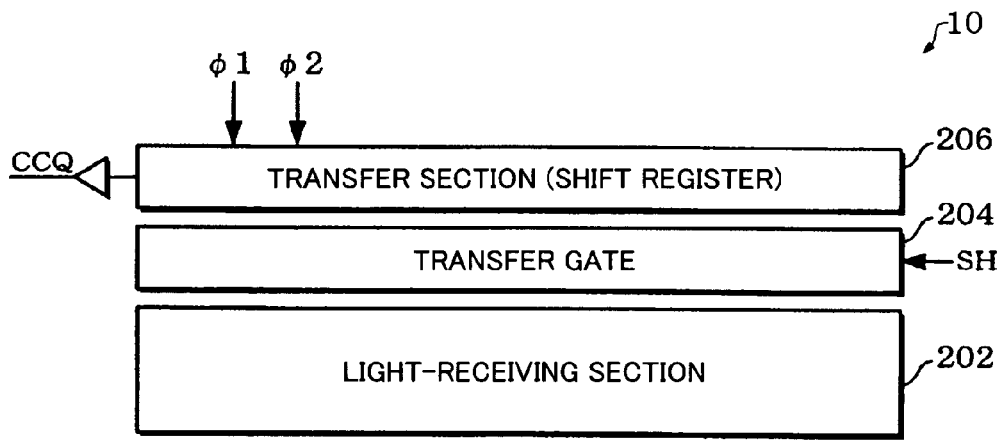
FIGS. 1A to 1C are views illustrative of an image sensor.

Several aspects of the invention may provide an analog front-end circuit which can implement a clamp level error correction after a line clamp operation, and an electronic instrument including the same.

According to one embodiment of the invention, there is provided an analog front-end circuit comprising:

an analog processing circuit that receives an analog input image signal from an image sensor, performs a given process on the input image signal, and outputs an analog image signal;

an A/D converter that A/D-converts the analog image signal input from the analog processing circuit;

a target register, a black level target value being set in the target register; and a calculation circuit that monitors an A/D-converted value output from the A/D converter and performs calculations, the analog processing circuit including:

a clamp circuit that performs a line clamp operation on the input image signal from the image sensor; and an offset adjustment circuit that includes an offset adjustment register and performs an offset adjustment on an image signal based on an offset adjustment value set in the offset adjustment register, the calculation circuit monitoring the A/D-converted value of a black reference pixel after the line clamp operation in a black level monitor period, the black level monitor period being a period after a line clamp period of the clamp circuit but before an effective pixel output period, and performing a black level error correction process relating to the line clamp operation by writing an offset adjustment value into the offset adjustment register, the offset adjustment value causing the A/D-converted value to be set at the black level target value set in the target register.

According to this embodiment, the clamp circuit performs the line clamp operation. The A/D-converted value is monitored in the black level monitor period after the line clamp period but before the effective pixel output period. The offset adjustment value for setting the A/D-converted value at the black level target value is written into the offset adjustment register, whereby the black level error correction process after the line clamp operation is implemented. According to this configuration, since an error of the black level is corrected by writing the offset adjustment value so that the black level target value (or a value set by the black level target value) is the correction target, a problem due to an error of the black level can be eliminated. According to this embodiment, the black level error correction process is performed in the black level monitor period before the effective pixel output period. Therefore, since the black level is set at the black level target value in the effective pixel output period, a problem due to an error of the black level can be effectively prevented.

In the analog front-end circuit according to this embodiment, the analog processing circuit may include a gain adjustment circuit that includes a gain adjustment register and performs a gain adjustment on an image signal based on a gain adjustment value set in the gain adjustment register;

the analog front-end circuit may further include a correction amount register, a correction amount being set in the correction amount register, the correction amount corresponding to a change amount of the A/D-converted value when changing the offset adjustment value set in the offset adjustment register by 1 LSB and changing corresponding to the gain adjustment value set in the gain adjustment register; and the calculation circuit may perform the black level error correction process based on the correction amount set in the correction amount register, the A/D-converted value monitored in the black level monitor period, and the black level target value set in the target register.

According to this configuration, when the gain adjustment value has changed, the correction amount changes corresponding to the gain adjustment value. Therefore, since the error correction process is implemented using a correction amount in which the gain adjustment value is reflected, the circuit can be simplified and reduced in size.

In the analog front-end circuit according to this embodiment, the calculation circuit may repeat a process that calculates a differential value between the A/D-converted value monitored in the black level monitor period and the black level target value and subtracts the correction amount from the differential value until a subtraction result becomes zero or less.

According to this configuration, the error correction process can be implemented without using a division circuit or the like, whereby the circuit can be further simplified and reduced in size.

In the analog front-end circuit according to this embodiment, the analog front-end circuit may further include an adjustment amount register, an adjustment amount being set in the adjustment amount register, the adjustment amount corresponding to the offset adjustment value that changes the A/D-converted value by one and changing corresponding to the gain adjustment value set in the gain adjustment register, the calculation circuit may perform the black level error correction process based on the adjustment amount set in the adjustment amount register, the correction amount set in the correction amount register, the A/D-converted value monitored in the black level monitor period, and the black level target value set in the target register.

According to this configuration, when the gain adjustment value has changed, the adjustment amount changes corresponding to the gain adjustment value. Therefore, since the error correction process is implemented by setting the offset adjustment value using an adjustment amount in which the gain adjustment value is reflected, the circuit can be simplified and reduced in size.

In the analog front-end circuit according to this embodiment, the calculation circuit may repeat a process that calculates a differential value between the A/D-converted value monitored in the black level monitor period and the black level target value, changes the offset adjustment value set in the offset adjustment register by the adjustment amount, and subtracts the correction amount from the differential value until a subtraction result becomes zero or less.

According to this configuration, the error correction process can be implemented without using a division circuit or the like, whereby the circuit can be further simplified and reduced in size.

In the analog front-end circuit according to this embodiment, the calculation circuit may perform an overcorrection error correction process in an overcorrection mode, the overcorrection error correction process changing the offset adjustment value set in the offset adjustment register by an amount m times (m is an integer equal to or larger than two) the adjustment amount.

According to this configuration, since the error correction process which cancels a change in the black level in a specific direction is performed in advance, a high-speed error correction can be implemented.

In the analog front-end circuit according to this embodiment, when a gain G set in the gain adjustment circuit is larger than a given value, the correction amount may be set at a value larger than one and the adjustment amount being set at one; and when the gain G is smaller than the given value, the correction amount may be set at one and the adjustment amount being set at a value larger than one.

According to this configuration, even when the gain is smaller than a given value so that the A/D-converted value does not change when changing the offset adjustment value by 1 LSB, the error correction process can be implemented by setting the adjustment amount of the offset adjustment value at a value larger than one.

In the analog front-end circuit according to this embodiment, when a change in voltage when changing the offset adjustment value set in the offset adjustment register by 1 LSB is referred to as VF, the number of bits of the A/D converter is referred to as k, and an A/D conversion range of the A/D converter is referred to as ADR, the correction amount A may be set at $[\{VF \times G \times (2^k-1)\}/ADR]$ and the adjustment amount B may be set at one when the gain G is larger than the given value, and the correction amount A may be set at one and the adjustment amount B may be set at $[ADR/\{VF \times G \times (2^k-1)\}]$ when the gain G is smaller than the given value.

According to this configuration, since the error correction process does not change even if the gain adjustment value has changed, the circuit can be simplified and reduced in size.

In the analog front-end circuit according to this embodiment, the calculation circuit may perform the black level error correction process in a first detection mode when the A/D-converted value in the black level monitor period has changed from the black level target value set in the target register, and may perform the black level error correction process in a second detection mode when the A/D-converted value in the black level monitor period is outside a detection range between an upper limit value and a lower limit value, the upper limit value being obtained by adding the correction amount to the black level target value, the lower limit value being obtained by subtracting the correction amount from the black level target value.

Since the error correction process is not performed when a change in the black level is within the detection range by providing the second detection mode, an oscillation mode phenomenon and the like can be suppressed.

In the analog front-end circuit according to this embodiment, the calculation circuit may perform the black level error correction process that causes the A/D-converted value to coincide with the black level target value set in the target register in a first correction target mode, and may perform the black level error correction process that causes the A/D-converted value to coincide with an upper limit value or a lower limit value in a second correction target mode, the upper limit value being obtained by adding the correction amount to the black level target value, the lower limit value being obtained by subtracting the correction amount from the black level target value.

According to this configuration, since the error correction process which cancels a change in the black level in a specific direction is performed in advance, a high-speed error correction can be implemented.

In the analog front-end circuit according to this embodiment, the calculation circuit may perform the black level error correction process corresponding to each line of the image sensor in a first detection line count setting mode, and may perform the black level error correction process in a second detection line count setting mode when a change in black level in an identical direction has been detected corresponding to a plurality of consecutive lines of the image sensor.

According to this configuration, since the error correction process is not performed immediately after the black level has changed, an oscillation mode phenomenon and the like can be suppressed.

According to another embodiment of the invention, there is provided an electronic instrument comprising:
one of the above analog front-end circuits; and
an image sensor.

Preferred embodiments of the invention are described in detail below. Note that the embodiments described below do not in any way limit the scope of the invention defined by the claims laid out herein. Note that all elements of the embodiments described below should not necessarily be taken as essential requirements for the invention.

1. Image Sensor

FIG. 1A shows a configuration example of an image sensor 10. The image sensor 10 (e.g., CCD line sensor) includes a light-receiving section 202, a transfer gate 204, and a transfer section 206 (shift register). The light-receiving section 202 includes a plurality of light-receiving elements (photodiodes or pixels) which perform photoelectric conversion.

Each light-receiving element (pixel) of the light-receiving section 202 produces and stores a charge corresponding to the amount of light received. A shift signal SH becomes active after a given period of time required for storing a charge has elapsed so that the transfer gate 204 is turned ON. As a result, the stored charge is transferred to the shift register (shift register provided corresponding to each light-receiving element) of the transfer section 206 through the transfer gate 204. The stored charge (image signal) transferred to each shift register is transferred to the adjacent shift registers based on two-phase drive clock signals $\phi 1$ and $\phi 2$. An image signal corresponding to the charge stored in each light-receiving element is thus serially output from a CCQ terminal of the image sensor 10.

Figure 1B:
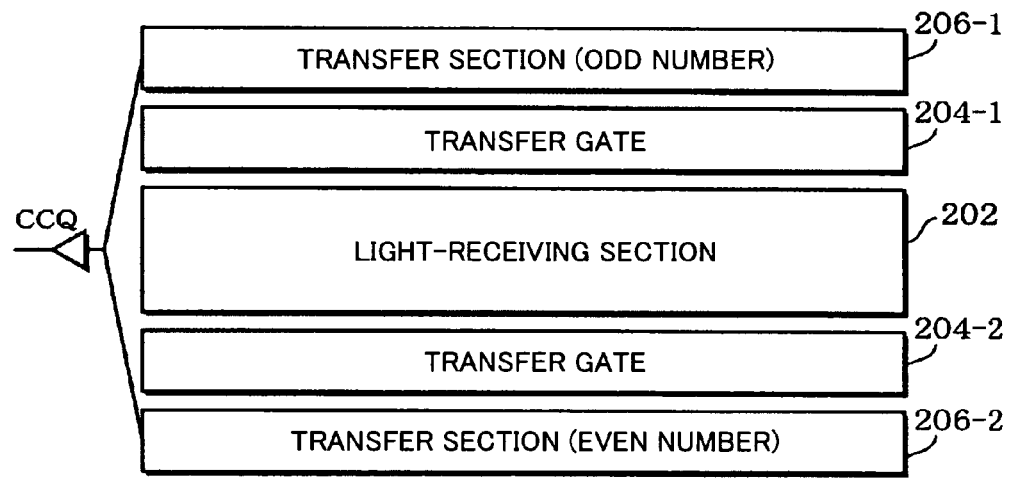
Figure 1C:
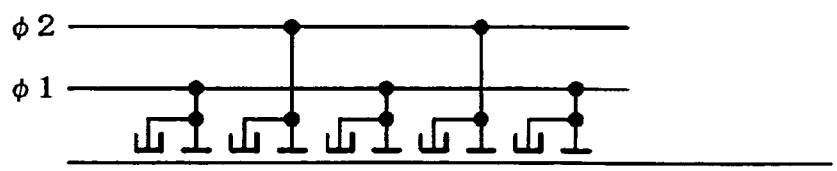

Note that the configuration of the image sensor 10 is not limited to the configuration shown in FIG. 1A. Various modifications may be made. For example, it is desirable to provide a transfer gate 204-1 and a transfer section 206-1 for odd-numbered pixels and a transfer gate 204-2 and a transfer section 206-2 for even-numbered pixels, as shown in FIG. 1B. It is also desirable to provide the light-receiving sections, the transfer gates, and the transfer sections for reading an R (red), G (green), and B (blue) image in the configurations shown in FIGS. 1A and 1B. FIG. 1C shows a configuration example of the shift register of the transfer section 206.

2. Configuration of Analog Front-End Circuit

Figure 2:
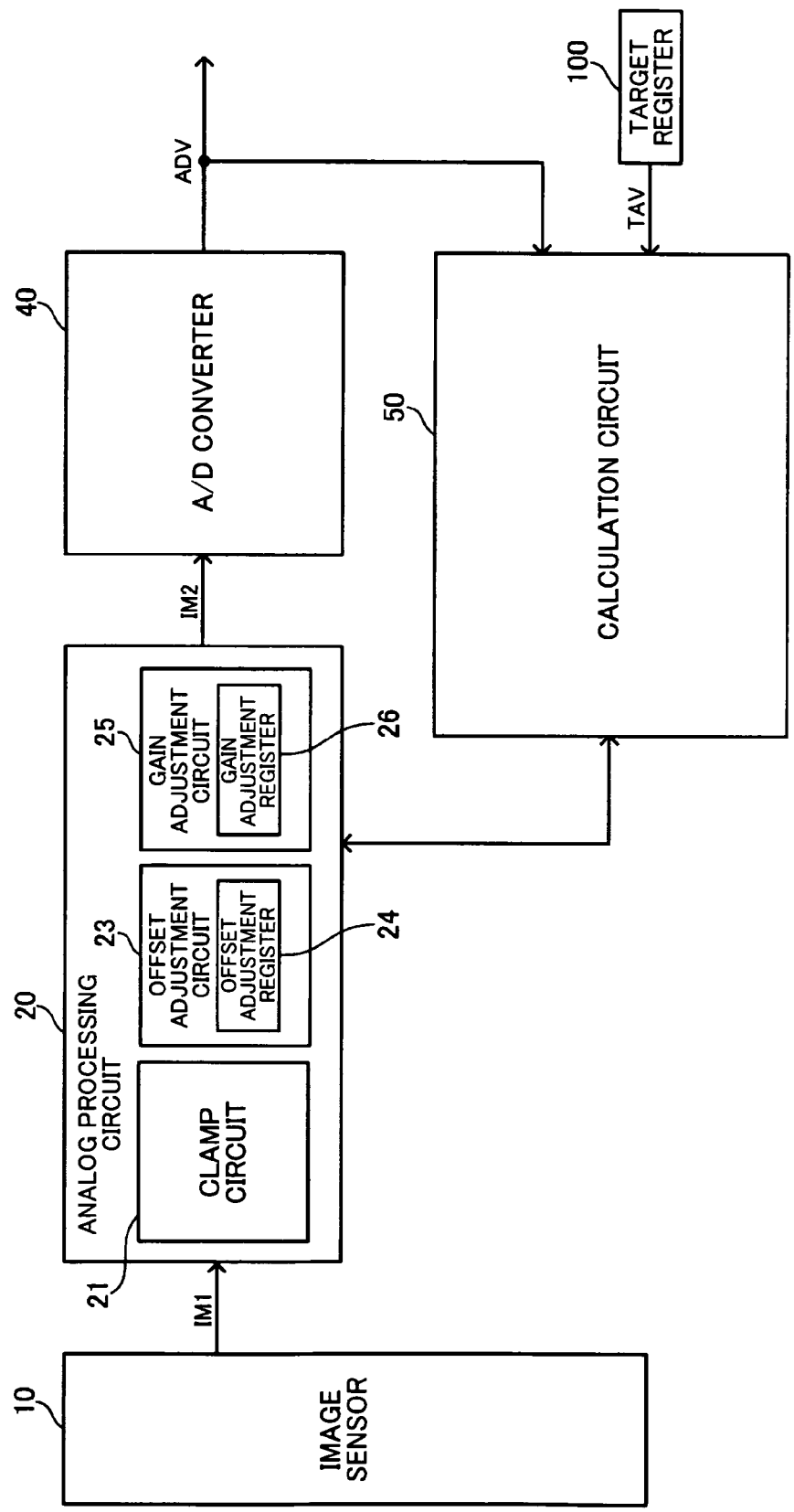
FIG. 2 shows a configuration example of an analog front-end circuit according to one embodiment of the invention.

FIG. 2 shows a configuration example of an analog front-end circuit (image processor or image processing controller) according to this embodiment. The analog front-end circuit (AFE) includes an analog processing circuit 20 and an A/D converter 40. The analog front-end circuit also includes a calculation circuit 50 and a target register 100. Note that the analog front-end circuit according to this embodiment is not limited to the configuration shown in FIG. 2. Various modifications may be made such as omitting some of the elements or adding other elements (e.g., timing generator, external interface, image data transmission circuit, or PLL circuit).

The analog processing circuit 20 (analog signal processing circuit) receives an analog input image signal IM1 from the image sensor 10 (line sensor) such as a CCD. The analog processing circuit 20 performs a given process (preprocess before A/D conversion) on the input image signal IM1, and outputs an analog image signal IM2. Specifically, the analog processing circuit 20 performs an offset adjustment or gain adjustment on the image signal IM1 as the given process, for example. Or, the analog processing circuit 20 performs a clamp operation which sets the image signal IM1 at a given clamp level, a correlated double sampling (CDS) process, an image signal sample and hold process, and the like.

The analog processing circuit 20 includes a clamp circuit 21, an offset adjustment circuit 23, and a gain adjustment circuit 25. Note that the analog processing circuit 20 may have a configuration in which some (e.g., gain adjustment circuit) of these elements are omitted.

The clamp circuit 21 performs a clamp operation on the input image signal IM1 from the image sensor 10. Specifically, the clamp circuit 21 performs a line clamp operation on the input image signal IM1. More specifically, the clamp circuit 21 draws the black level (i.e., the level of a black reference pixel) of the image signal IM1 toward the clamp level (sets the black level at the clamp level) in a line clamp period before an effective pixel output period. In the effective pixel output period, the differential voltage between the level of the image signal of the effective pixel and the black level drawn toward the clamp level is subjected to A/D conversion, and the resulting A/D-converted value is output from the A/D converter 40. In this case, the line clamp operation is performed corresponding to each line of the image sensor 10 (line sensor). The clamp circuit 21 may also perform a bit clamp operation or the like on the image signal IM1 depending on the mode setting. The clamp circuit 21 performs correlated double sampling when performing the bit clamp operation.

The offset adjustment circuit 23 includes an offset adjustment register 24. The offset adjustment circuit 23 adjusts the offset of an image signal based on an offset adjustment value set in the offset adjustment register 24. The gain adjustment circuit 25 includes a gain adjustment register 26. The gain adjustment circuit 25 adjusts the gain of an image signal based on a gain adjustment value set in the gain adjustment register 26. For example, the gain adjustment circuit 25 adjusts the gain of the image signal subjected to an offset adjustment. When the image sensor 10 outputs a color image signal, R, G, and B offset adjustment values may be set in the offset adjustment register 24, and R, G, and B gain adjustment values may be set in the gain adjustment register 26, for example.

The A/D converter 40 A/D-converts the image signal IM2 output from the analog processing circuit 20. The A/D converter 40 outputs an A/D-converted value ADV (i.e., digital image data). As the A/D converter 40, a pipeline A/D converter having a plurality of cascade-connected pipeline stages may be used, for example. Each pipeline stage of the pipeline A/D converter quantizes the input image signal using a sub-A/D converter to convert the input image signal into digital data, and D/A-converts the digital data using a sub-D/A converter. Each pipeline stage then performs a subtraction process on the input image signal and the analog signal obtained by the sub-D/A converter, amplifies the resulting signal, and outputs the amplified signal to the subsequent pipeline stage. The A/D converter 40 is not limited to the pipeline A/D converter, but may be another A/D converter known in the art.

A black level target value is set in the target register 100. The black level target value may be set by an external CPU (firmware which operates on the CPU), for example.

The calculation circuit 50 (correction circuit) monitors the A/D-converted value ADV output from the A/D converter 40, and performs calculations (corrections). Specifically, the calculation circuit 50 monitors the A/D-converted value ADV of the black reference pixel after the line clamp operation in a black level monitor period after the line clamp period of the clamp circuit 21 but before the effective pixel output period. The black reference pixel may be a pixel in a shield area of the image sensor 10, or may be a pixel when a document lamp is turned OFF.

The calculation circuit 50 then writes an offset adjustment value for setting the A/D-converted value ADV (the average value of the A/D-converted value ADV) at a black level target value TAV set in the target register 100 (i.e., an offset adjustment value for causing the A/D-converted value ADV to coincide with the black level target value TAV) into the offset adjustment register 24. This implements a black level error correction process after the line clamp operation. Specifically, when the black level of the image signal which has been drawn toward the clamp level by the line clamp operation has changed from the clamp level, the calculation circuit 50 writes the offset adjustment value which causes the A/D-converted value ADV of the black level to coincide with the black level target value into the offset adjustment register 24. This implements a correction process which eliminates an error between the black level and the clamp level.

The calculation circuit 50 also performs calculations for an initial offset adjustment and an initial gain adjustment. Specifically, the calculation circuit 50 monitors and acquires the A/D-converted value ADV in a lower limit value output period (black reference pixel output period in a narrow sense) in which the A/D-converted value corresponding to the lower limit value (minimum value) of the input range is output from the A/D converter 40. The calculation circuit 50 then performs an offset setting process (lower limit value setting process) which sets an offset adjustment value which causes the A/D-converted value ADV (the average value of the A/D-converted value ADV) to become closer to the lower limit target value (i.e., an offset adjustment value which causes the A/D-converted value ADV to coincide with the lower limit target value) in the offset adjustment register 24. Or, the calculation circuit 50 monitors and acquires the A/D-converted value ADV in an upper limit value output period (white pixel output period in a narrow sense) in which the A/D-converted value corresponding to the upper limit value (maximum value) of the input range is output from the A/D converter 40. The calculation circuit 50 then performs a gain setting process (upper limit value setting process) which sets a gain adjustment value which causes the A/D-converted value ADV (the average value of the A/D-converted value ADV) to become closer to the upper limit target value (i.e., a gain adjustment value which causes the A/D-converted value ADV to coincide with the upper limit target value) in the gain adjustment register 26.

Figure 3A:
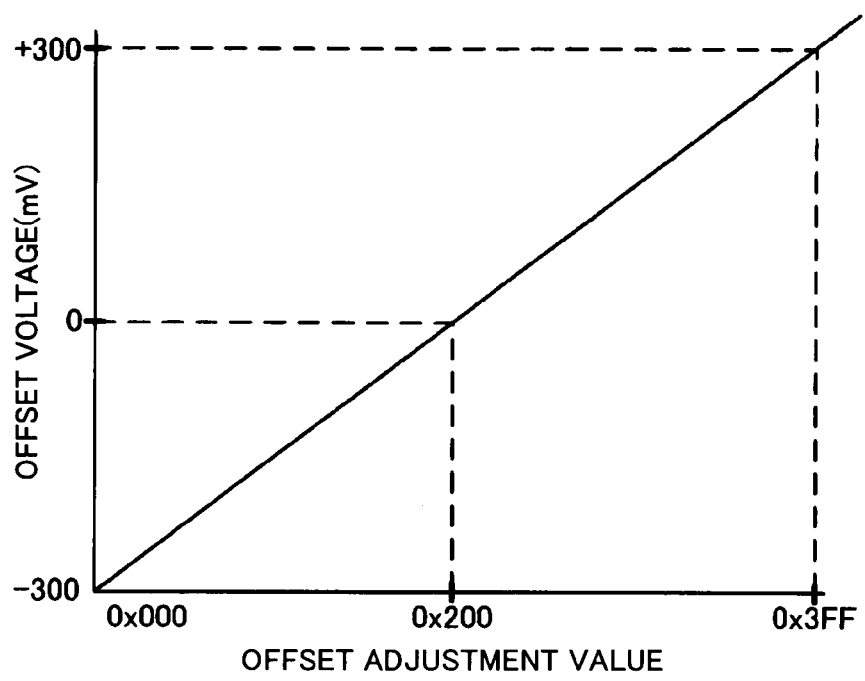
FIGS. 3A and 3B are views respectively showing the relationship between an offset adjustment value and an offset voltage and the relationship between a gain adjustment value and a gain.

FIG. 3A shows an example of the relationship between the offset adjustment value and the offset voltage of the offset adjustment circuit 23. For example, when an offset adjustment value 0x200 is set in the offset adjustment register 24 with a 10-bit width (n-bit width in a broad sense), an offset voltage added to the image signal by the offset adjustment circuit 23 is 0 V. When an offset adjustment value 0x000 or 0x3FF is set in the offset adjustment register 24, the offset voltage added to the image signal is −300 mV or +300 mV, respectively. Specifically, the offset voltage is a monotone function with respect to the offset adjustment value, as shown in FIG. 3A.

Figure 3B:
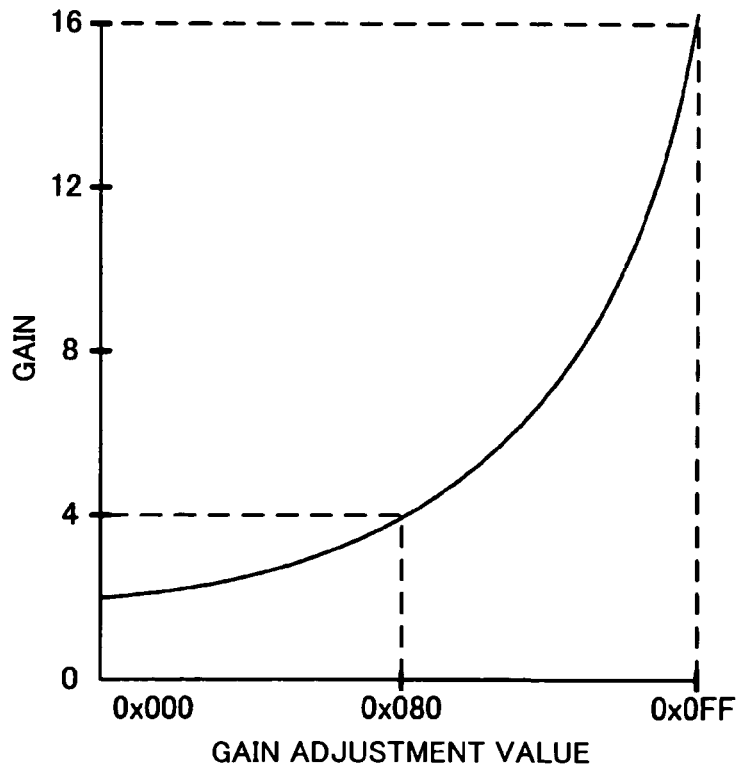

FIG. 3B shows an example of the relationship between the gain adjustment value and the gain in the gain adjustment circuit 25. For example, when a gain adjustment value 0x080 is set in the gain adjustment register 26 with an 8-bit width, the gain of the gain adjustment circuit 25 (programmable gain amplifier (PGA)) is about four. When a gain adjustment value 0x0FF is set in the gain adjustment register 26, the gain of the gain adjustment circuit 25 is about 16. Specifically, the gain is a monotone function with respect to the gain adjustment value, as shown in FIG. 3B.

An adjustment which fully utilizes the conversion range of the A/D converter 40 can be implemented by performing an offset adjustment and a gain adjustment shown in FIGS. 3A and 3B.

Figure 4:
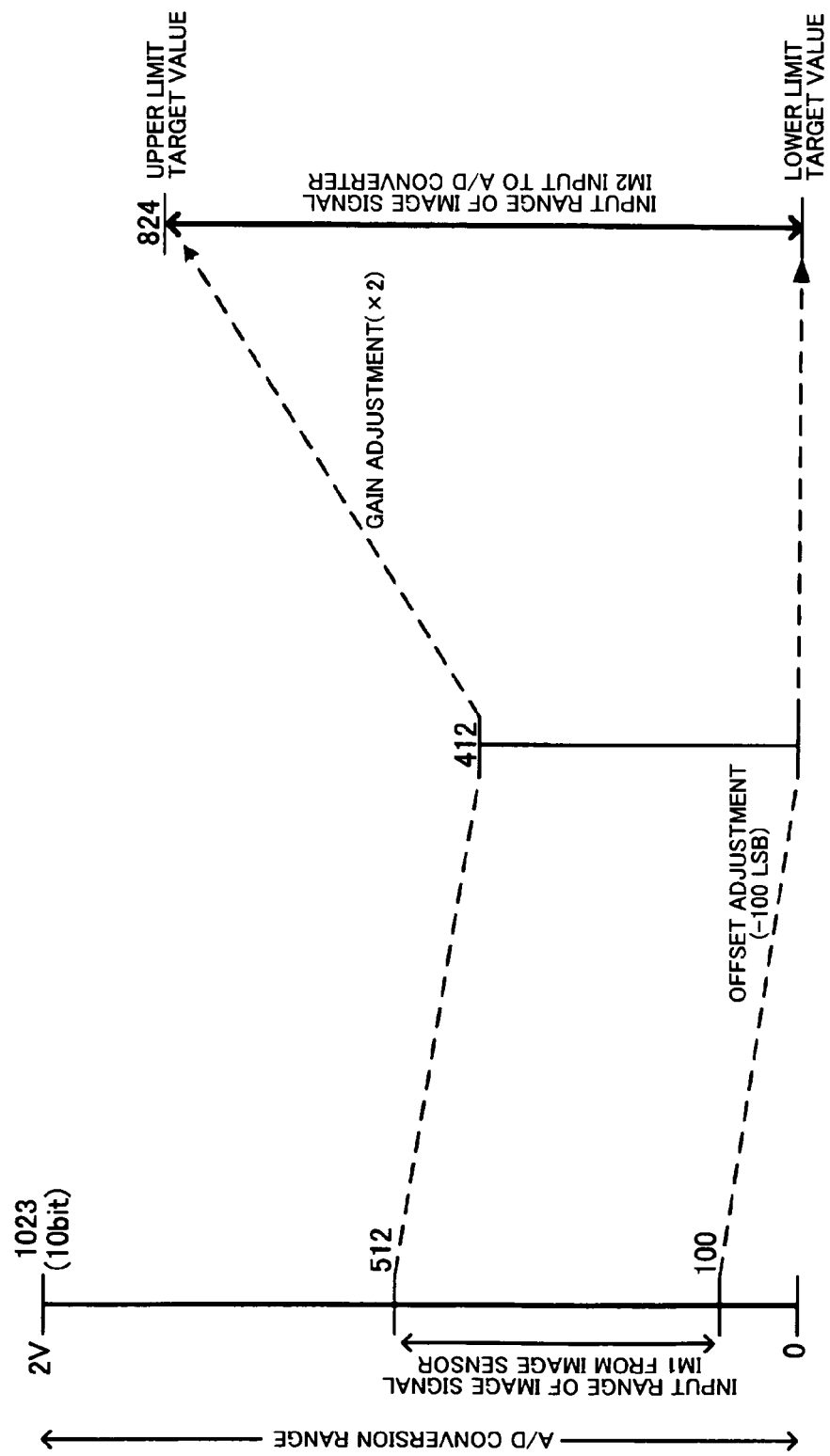
FIG. 4 is a view illustrative of effective utilization of the conversion range of an A/D converter.

In FIG. 4, the A/D conversion range of the 10-bit A/D converter 40 is 0 to 1023 (0 to 1023 LSB), for example. The A/D conversion range is 0 to 2 V as an analog voltage range, for example. The LSB of the A/D converter 40 is indicated by 1. The input range of the input image signal IM1 from the image sensor 10 is 100 to 512 (100 to 512 LSB). Since the input range of the input image signal IM1 is narrower than the A/D conversion range (0 to 1023), the conversion characteristics of the A/D converter 40 are not fully utilized.

In FIG. 4, the lower limit target value of the input range of the image signal IM2 input to the A/D converter 40 is set at 0 (i.e., offset adjustment of −100 (−100 LSB)), for example. Therefore, the minimum value (lower limit value) of the input range of the image signal IM2 is shifted from 100 to 0 by the offset adjustment. In this case, the maximum value (upper limit value) of the input range is shifted from 512 to 412.

In FIG. 4, the upper limit target value of the input range of the image signal IM2 input to the A/D converter 40 is set at 824 (×2 gain adjustment), for example. Therefore, the maximum value (upper limit value) of the input range of the image signal IM2 is shifted from 412 to 824 by the gain adjustment.

This causes the input range of the image signal IM2 to increase from 100 to 512 to 0 to 824 and become almost equal to the A/D conversion range (0 to 1024), whereby the conversion characteristics of the A/D converter 40 can be fully utilized.

3. Black Level Error Correction

Figure 5A:
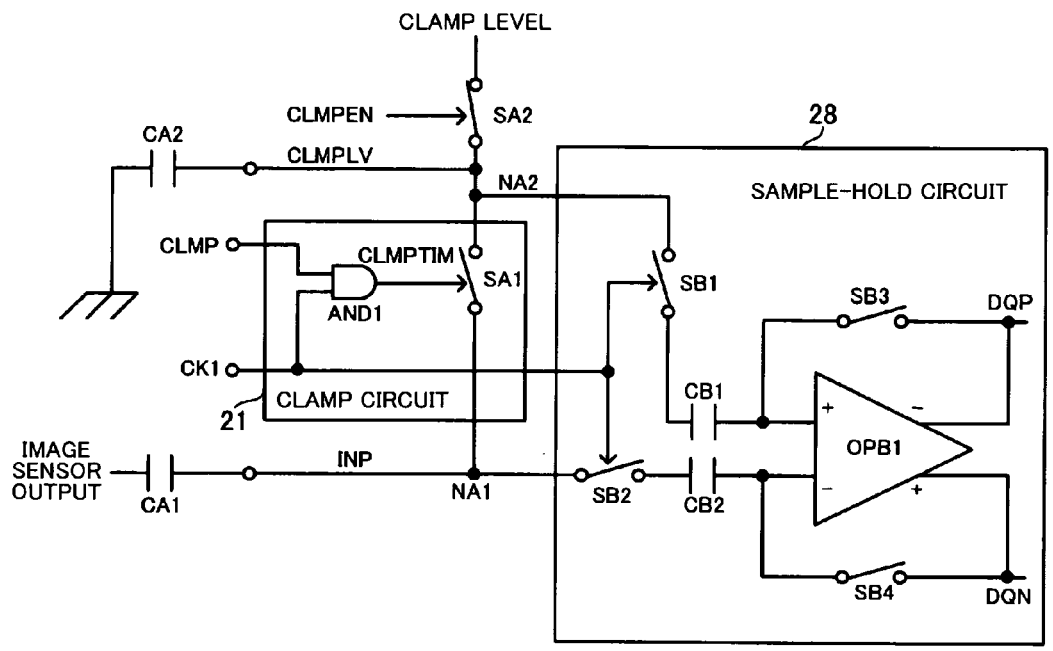
FIGS. 5A and 5B show a configuration example and a signal waveform example of a clamp circuit.
Figure 5B:
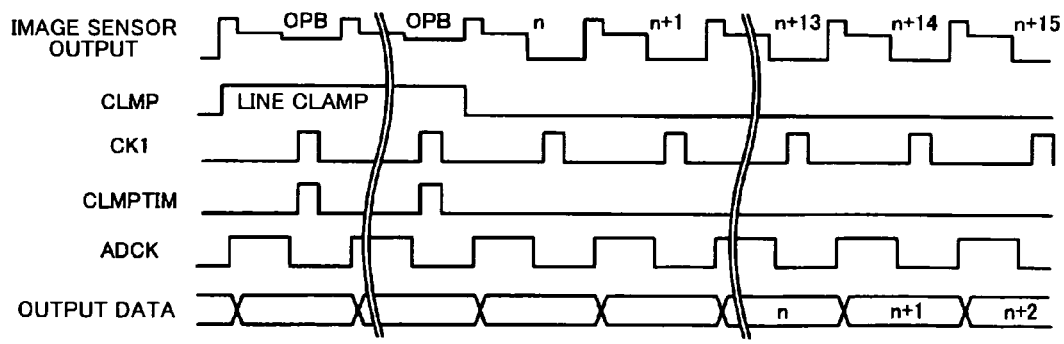

FIG. 5A shows a configuration example of the clamp circuit 21, and FIG. 5B shows a signal waveform example illustrative of the line clamp operation.

The clamp circuit 21 includes an AND circuit AND1 and a switching element SA1. A clamp signal CLMP and a sampling clock signal CK1 having waveforms shown in FIG. 5B are input to the AND circuit AND1. The AND circuit AND1 outputs a clamp timing signal CLMPTIM having a waveform shown in FIG. 5B. The switching element SA1 is ON/OFF-controlled using the signal CLMPTIM. Specifically, the signal CLMPTIM becomes active in a line clamp period in which the signal CLMP becomes active (H level) so that the switching element SA1 is turned ON. This causes the black level of the image signal from the image sensor 10 to be drawn toward a clamp level CLMPLV.

A sample-hold circuit 28 samples and holds the image signal from the image sensor 10. Specifically, the sample-hold circuit 28 samples and holds the differential voltage between the level of the image signal and the black level drawn toward the clamp level (black level set at the clamp level). The sample-hold circuit 28 may be provided in the subsequent stage of the offset adjustment circuit 23. In FIG. 5A, the sample-hold circuit 28 is provided in the subsequent stage of the clamp circuit 21 for convenience of description. The sample-hold circuit 28 includes an operational amplifier OPB1, sample-hold switching elements SB1, SB2, SB3, and SB4, and sample-hold capacitors CB1 and CB2.

In FIG. 5A, the clamp level generated by a clamp level setting circuit included in the analog front-end circuit is input as the signal CLMPLV through a switching element SA2 and is held at a node NA2. A capacitor CA2 is an external capacitor for stabilizing the clamp level CLMPLV. When externally inputting the clamp level, the switching element SA2 is turned OFF using a signal CLMPEN, and the clamp level is input from the node on one end of the capacitor CA2.

The AC component of the image signal output from the image sensor 10 is input to a node NA1 as a signal INP through an external AC coupling capacitor CA1. The sample-hold circuit 28 samples and holds the differential voltage between the level of the image signal at the node NA1 and the black level drawn toward the clamp level CLMPLV.

Specifically, the analog image signal output from the image sensor 10 contains a DC offset component. It is necessary to remove the DC offset component so that the voltage level of the image signal does not exceed the input allowable range of the analog front-end circuit to set the voltage level of the image signal at an appropriate voltage level. Therefore, the AC coupling capacitor CA1 is provided between the output of the image sensor 10 and the input of the analog front-end circuit in FIG. 5A, and the clamp circuit 21 performs the line clamp operation which draws the black level of the image signal toward the clamp level CLMPLV.

Figure 6:
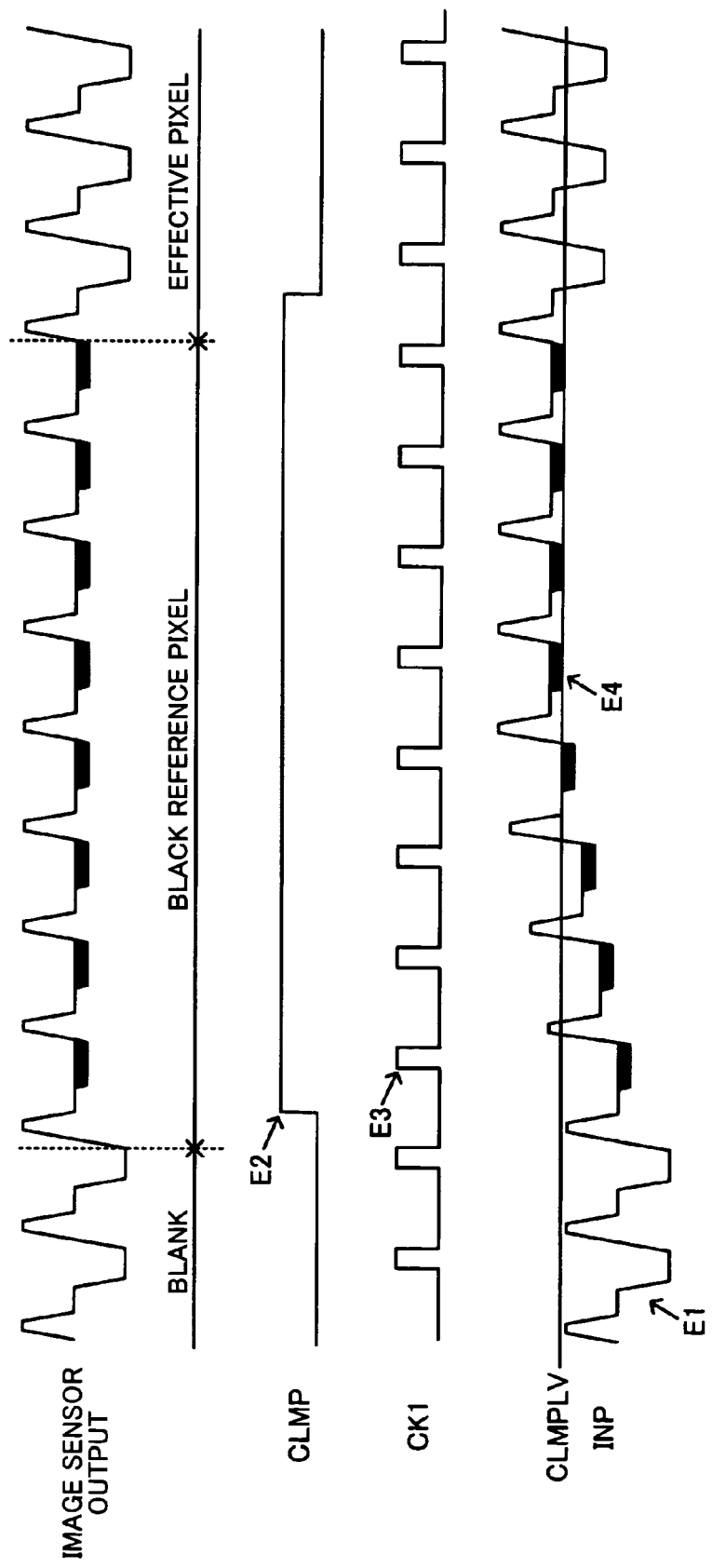
FIG. 6 shows a signal waveform example illustrative of a line clamp operation.

For example, the black level of the image signal is not drawn toward the clamp level CLMPLV at E1 in FIG. 6. When the clamp signal CLMP and the sampling clock signal CK1 have become active, as indicated by E2 and E3, the switching element SA1 is turned ON so that the line clamp operation is performed. The black level of the image signal is drawn toward and coincides with the clamp level CLMPLV, as indicated by E4, whereby the line clamp operation is implemented. In the effective pixel output period after the line clamp period, the sample-hold circuit 28 samples and holds the differential voltage between the level of the image signal and the black level drawn toward the clamp level CLMPLV, and the A/D converter 40 calculates the A/D-converted value of the differential voltage. This makes it possible to calculate the A/D-converted value of the level of the image signal based on the black level.

The black level of the image signal can be drawn toward the clamp level CLMPLV because the switching element SA1 is turned OFF after the line clamp period so that the node NA1 shown in FIG. 5A is set in a high impedance state.

However, when a leakage current flows into the node NA1 through the switching element SB2, for example, the black level which has been drawn toward the clamp level CLMPLV as indicated by E4 in FIG. 6 changes, whereby an error occurs between the black level and the clamp level CLMPLV. As a result, a residual image occurs when a sudden change in density of a document (e.g., change from white to black) has occurred when reading an image, for example.

Figure 7:
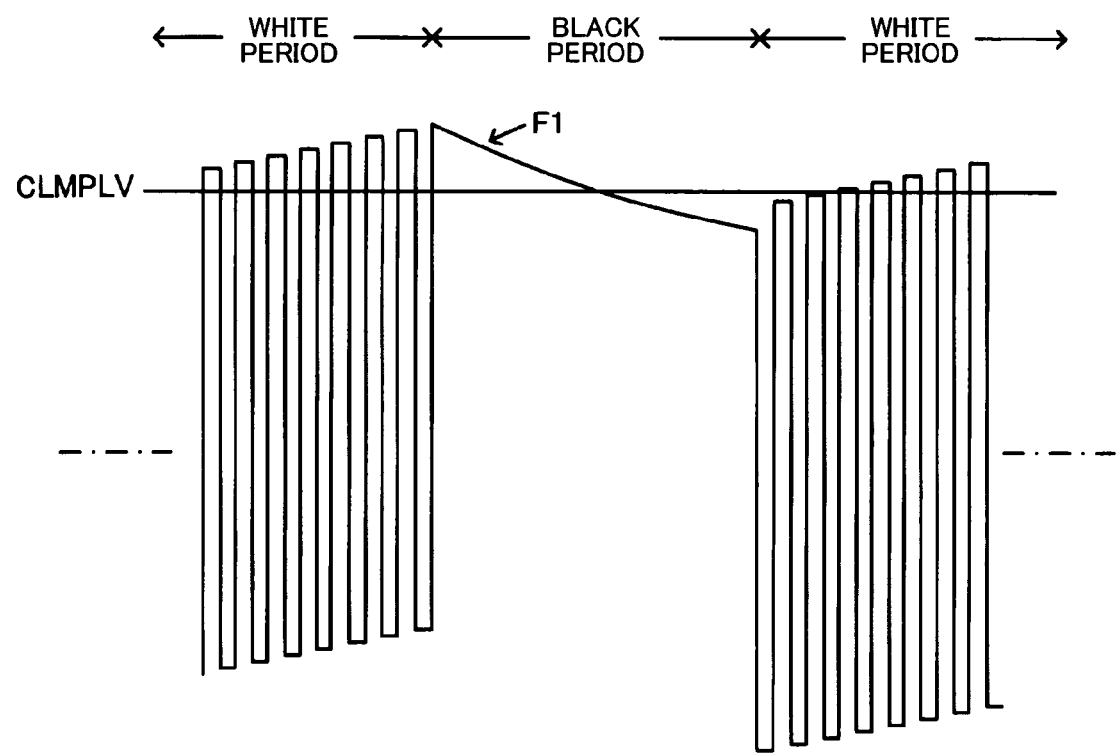
FIG. 7 is a view illustrative of an error of a black level which occurs after a line clamp operation.
Figure 8:
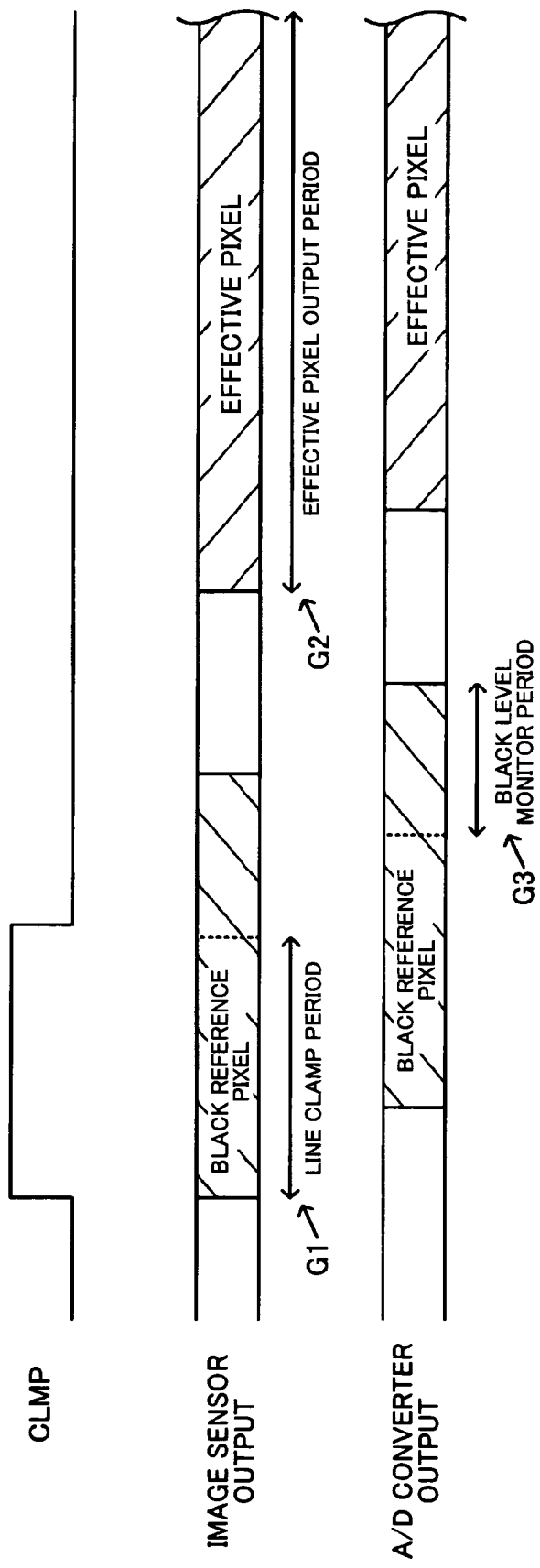
FIG. 8 is a view illustrative of a black level error correction process according to one embodiment of the invention.

In this embodiment, the A/D-converted value ADV of the black reference pixel after the line clamp operation is monitored in the black level monitor period indicated by G3 in FIG. 8 after the line clamp period indicated by G1 but before the effective pixel output period (effective pixel period) indicated by G2. The offset adjustment value for setting the A/D-converted value in the black level monitor period at the black level target value TAV is written into the offset adjustment register 24. Specifically, the offset control value is written into the offset adjustment register 24 so that the black level target value TAV or the value (lower limit value or upper limit value) set by the black level target value TAV is the correction target of the A/D-converted value to correct an error of the black level after the line clamp operation indicated by F1 in FIG. 7. This prevents a problem in which a residual image occurs when a sudden change in density of a document has occurred when reading an image, for example.

This embodiment is characterized in that an error of the black level drawn toward the clamp level CLMPLV as indicated by E4 in FIG. 6 in the line clamp period indicated by G1 in FIG. 8 is corrected in the black level monitor period before the effective pixel output period. Specifically, this embodiment is characterized in that an error correction which causes the black level to coincide with the black level target value TAV is performed in the black level monitor period. Since the black level accurately coincides with the black level target value TAV in the effective pixel output period by correcting an error of the black level in the black level monitor period before the effective pixel output period, a problem which occurs due to an error of the black level when reading an image can be effectively prevented.

4. Detailed Configuration Example

Figure 9:
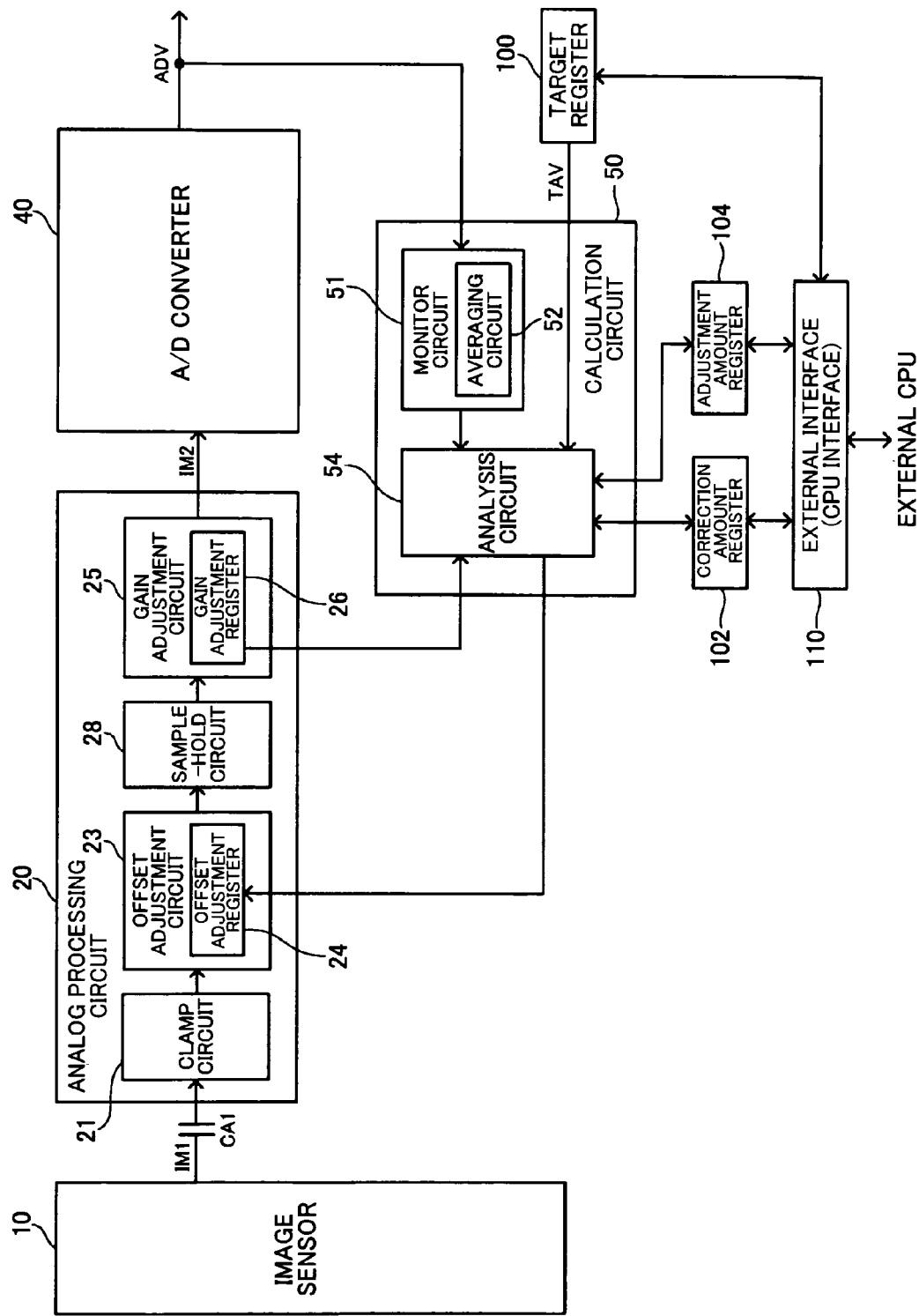
FIG. 9 shows a detailed configuration example of an analog front-end circuit according to one embodiment of the invention.

FIG. 9 shows a detailed configuration example of the analog front-end circuit. Note that the analog front-end circuit is not limited to the configuration shown in FIG. 9. Various modifications may be made such as omitting some elements (e.g., external interface) or adding other elements.

In FIG. 9, a correction amount register 102 and an adjustment amount register 104 are provided in addition to the elements shown in FIG. 2.

The correction amount register 102 is a register in which the correction amount (A) for the black level error correction process is set. The correction amount corresponds to the change amount of the A/D-converted value when changing the offset adjustment value of the offset adjustment register 24 by 1 LSB. When the gain adjustment circuit 25 is provided in the analog processing circuit 20, the correction amount changes depending on the gain adjustment value set in the gain adjustment register 26.

When the gain set using the gain adjustment value is small, the change amount of the A/D-converted value may be one or less when changing the offset adjustment value by 1 LSB. In this case, the correction amount is set at one, for example.

The adjustment register 104 is a register in which the adjustment amount (B) for the black level error correction process is set. The adjustment amount corresponds to an offset adjustment value which changes the A/D-converted value of the A/D converter 40 by one. When the gain adjustment circuit 25 is provided in the analog processing circuit 20, the adjustment amount changes depending on the gain adjustment value set in the gain adjustment register 26. When the gain set using the gain adjustment value is large, the offset adjustment value which changes the A/D-converted value by one may be smaller than one. In this case, the adjustment amount is set at one, for example.

In FIG. 9, an external interface 110 (CPU interface or host interface) is provided. A CPU (host processor or firmware) can access the target register 100, the correction amount register 102, and the adjustment amount register 104 through the external interface 110. The CPU can set the black level target value in the target register 100, and check the correction amount and the adjustment amount set in the correction amount register 102 and the adjustment amount register 104.

The calculation circuit 50 includes a monitor circuit 51 and an analysis circuit 54. The monitor circuit 51 monitors the A/D-converted value ADV output from the A/D converter 40. Specifically, the monitor circuit 51 includes an averaging circuit 52. The averaging circuit 52 monitors the A/D-converted value of the black reference pixel in the black level monitor period indicated by G3 in FIG. 8. The averaging circuit 51 extracts the A/D-converted values of the image signals of a plurality of pixels in each processing line of the image sensor 10, and averages the A/D-converted values, for example. The calculation circuit 50 compares the average value of the A/D-converted values relating to a plurality of pixels with the black level target value set in the target register 100.

The analysis circuit 54 (calculation circuit 50) analyzes the A/D-converted value, and performs the black level error correction process. For example, the analysis circuit 54 performs the black level error correction process based on the correction amount set in the correction amount register 102, the A/D-converted value (average value) monitored by the monitor circuit 51 in the black level monitor period, and the black level target value TAV set in the target register 100. When the adjustment amount register 104 is provided, the analysis circuit 54 performs the black level error correction process based on the adjustment amount set in the adjustment amount register 104, the correction amount, the A/D-converted value, and the black level target value TAV.

Specifically, the analysis circuit 54 calculates the differential value (absolute value of the differential value) between the A/D-converted value (average value) monitored in the black level monitor period and the black level target value TAV. The analysis circuit 54 repeats a process that subtracts the correction amount set in the correction amount register 102 from the calculated differential value until the subtraction result (result obtained by subtracting the correction amount from the differential value) becomes zero or less. Specifically, the analysis circuit 54 sequentially subtracts the correction amount from the differential value until the subtraction result becomes zero or less. When the adjustment amount register 104 is provided, the analysis circuit 54 repeats a process that calculates the differential value between the A/D-converted value and the black level target value TAV, changes the offset adjustment value set in the offset adjustment register 24 by the adjustment amount, and subtracts the correction amount from the differential value until the subtraction result becomes zero or less.

The analysis circuit 54 (calculation circuit 50) sets the correction amount in the correction amount register 102, and sets the adjustment amount in the adjustment amount register 104. Specifically, the analysis circuit 54 receives the gain adjustment value set in the gain adjustment register 26. The analysis circuit 54 calculates the correction amount and the adjustment amount corresponding to the gain adjustment value set in the gain adjustment register 26 based on a decoder (table) provided in the analysis circuit 54, and writes the correction amount and the adjustment amount in the correction amount register 102 and the adjustment amount register 104.

Note that the analysis circuit 54 may monitor the A/D-converted value, and set the correction amount and the adjustment amount based on the monitored A/D-converted value and the gain adjustment value. For example, the analysis circuit 54 monitors the A/D-converted value, detects the change amount of the A/D-converted value when changing the offset adjustment value set in the offset adjustment register 24 by 1 LSB as the correction amount, and sets the detected correction amount in the correction amount register 102. More specifically, the analysis circuit 54 calculates the differential value between the A/D-converted value when changing the offset adjustment value by 1 LSB and the A/D-converted value before changing the offset adjustment value, detects the calculated differential value as the correction amount, and sets the correction amount in the correction amount register 102.

5. Operation

Figure 10:
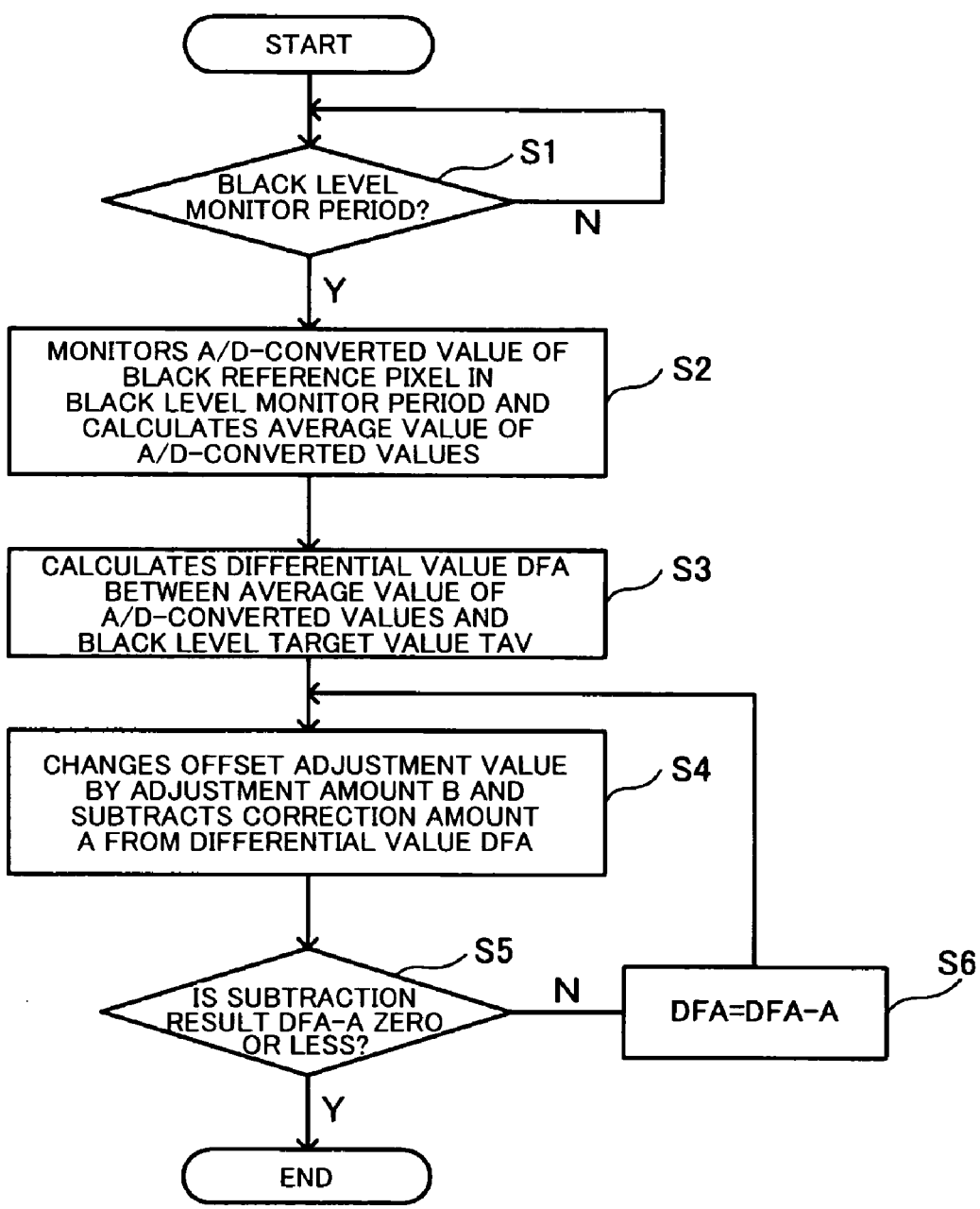
FIG. 10 is a flowchart illustrative of an operation according to one embodiment of the invention during an error correction process.

FIG. 10 shows a flowchart illustrative of the operation according to this embodiment during the error correction process. The calculation circuit 50 determines whether or not the black level monitor period has been reached (step S1). The calculation circuit 50 may determine whether or not the black level monitor period has been reached based on register information (pixel number or pixel count information) for designating the black reference pixel output period or the black level monitor period in the black reference pixel output period. When the black level monitor period has been reached, the calculation circuit 50 (monitor circuit 51) monitors the A/D-converted value of the black reference pixel in the black level monitor period, and calculates the average value of the A/D-converted values (step S2).

The calculation circuit 50 then calculates a differential value DFA between the average value of the A/D-converted values obtained in the step S2 and the black level target value (step S3). For example, the calculation circuit 50 subtracts the black level target value from the average value of the A/D-converted values, and calculates the absolute value of the subtraction result. The calculation circuit 50 changes the offset adjustment value set in the offset adjustment register 24 by the adjustment amount B set in the adjustment amount register 104, and subtracts the correction amount A set in the correction amount register 102 from the differential value DFA obtained in the step S3.

The calculation circuit 50 then determines whether or not the subtraction result DFA−A is zero or less (step S5). When the subtraction result DFA−A is not zero or less, the calculation circuit 50 sets the subtraction result DFA−A at the differential value DFA (step S6), returns to the step S4, and repeats the process in the step S4. When the subtraction result DFA−A is zero or less, the calculation circuit 50 finishes the process.

In FIG. 11A, the A/D-converted value in the black level monitor period is 0x40 (hexadecimal representation), and the black level target value is 0x20, for example. Therefore, the differential value DFA is 0x40−0x20=0x20. In FIG. 11A, the correction amount A is set at eight (A=8), and the adjustment amount B is set at one (B=1).

In this case, the offset adjustment value set in the offset adjustment register 24 is changed by the adjustment amount B (i.e., one) in the first process. The correction amount A (i.e., eight) is subtracted from the differential value DFA (i.e., 0x20) to obtain a subtraction result 0x18. Since the subtraction result is not zero or less, the second process is performed.

In the second process, the offset adjustment value is changed by the adjustment amount B (i.e., one), and the correction amount A (i.e., eight) is subtracted from the differential value DFA (i.e., 0x18) (subtraction result of the first process) to obtain a subtraction result 0x10. Since the subtraction result is not zero or less, the third process is performed. In the fourth process after the third process, since a subtraction result 0x00 (=0x08−8) is obtained (i.e., zero or less), the process is terminated. Note that the process is also terminated when the subtraction result is a negative value, for example.

According to this embodiment, since the black level error correction process can be implemented by merely calculating the differential value and subtracting the correction amount from the differential value, the process performed by the calculation circuit 50 can be simplified so that the circuit scale can be reduced. For example, when the error correction process is implemented by providing a division circuit, the process becomes complicated, or the circuit scale increases. According to this embodiment, such a situation can be prevented.

According to this embodiment, since the error correction process is implemented using the correction amount and the adjustment amount in which the gain adjustment value is reflected, the process shown in FIG. 10 does not change even if the gain adjustment value changes due to the initial gain adjustment shown in FIG. 4. Therefore, the circuit can be further simplified so that the circuit scale can be reduced.

6. Correction Amount and Adjustment Amount

FIG. 12 shows a setting example of the correction amount A and the adjustment amount B according to this embodiment. In FIG. 12, when the gain G is larger than two (G>2) (when the gain is larger than a given value in a broad sense), the correction amount A is set at a value larger than one, and the adjustment amount B is set at one. On the other hand, when the gain G is smaller than two (G<2) (when the gain is smaller than a given value in a broad sense), the correction amount A is set at one, and the adjustment amount B is set at a value larger than one.

Specifically, a change in voltage when changing the offset adjustment value set in the offset adjustment register 24 by 1 LSB is referred to as VF, the number of bits of the A/D converter 40 is referred to as k, and the A/D conversion range of the A/D converter 40 is referred to as ADR. In this case, when the gain G is larger than two (G>2), the correction amount A is set at $[\{VF \times G \times (2^k-1)\}/ADR]$, and the adjustment amount B is set at one. For example, when VF=0.586 mV, G=4, k=10, and ADR=1.2 Vp-p, the correction amount A is set at two.

When the gain G is smaller than two (G<2), the correction amount A is set at one, and the adjustment amount B is set at $[ADR/\{VF \times G \times (2^k-1)\}]$. For example, when VF=0.586 mV, G=0.5, k=10, and ADR=1.2 Vp-p, the adjustment amount B is set at four.

Specifically, when the gain G is large (G>2), the A/D-converted value changes when changing the offset adjustment value by 1 LSB. In this case, the adjustment amount B is set at one, and the error correction process is implemented by repeating the process that changes the offset adjustment value by the adjustment amount B (i.e., one) and subtracts the correction amount A (i.e., $[\{VF \times G \times (2^k-1)\}/ADR]$) from the differential value DFA in the step S4 shown in FIG. 10.

When the gain G is small (G<2), the A/D-converted value does not change when changing the offset adjustment value by 1 LSB. In this case, the adjustment amount B of the offset adjustment value is set at $[ADR/\{VF \times G \times (2^k-1)\}]$ larger than one. The error correction process is implemented by repeating the process that changes the offset adjustment value by the adjustment amount B (i.e., $[ADR/\{VF \times G \times (2^k-1)\}]$) and subtracts the correction amount A (i.e., one) from the differential value DFA in the step S4 shown in FIG. 10.

Therefore, the process shown in FIG. 10 does not change even if the gain adjustment value changes due to the initial gain adjustment shown in FIG. 4. Accordingly, the configuration of the analysis circuit 54 (calculation circuit 50) can be simplified so that the circuit scale can be reduced.

7. Black Level Change Detection Mode

In this embodiment, various modes are provided as a black level change detection mode. The black level change detection mode can be switched between these modes by changing a value set in a register provided in the analog front-end circuit.

Figure 13A:
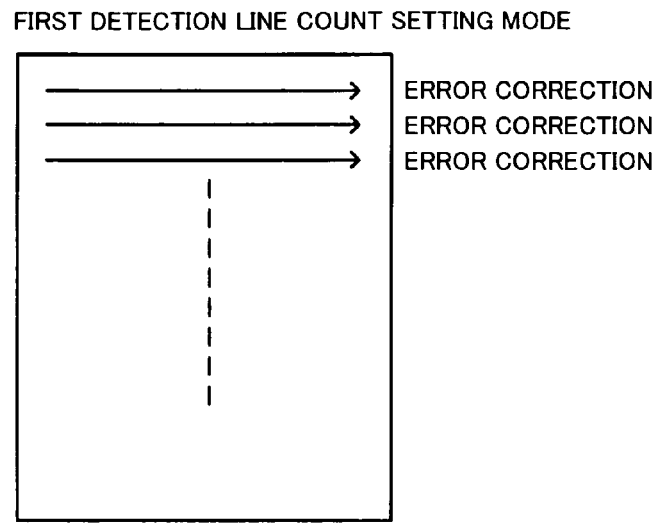
FIGS. 13A and 13B are views illustrative of first and second detection line count setting modes.
Figure 13B:
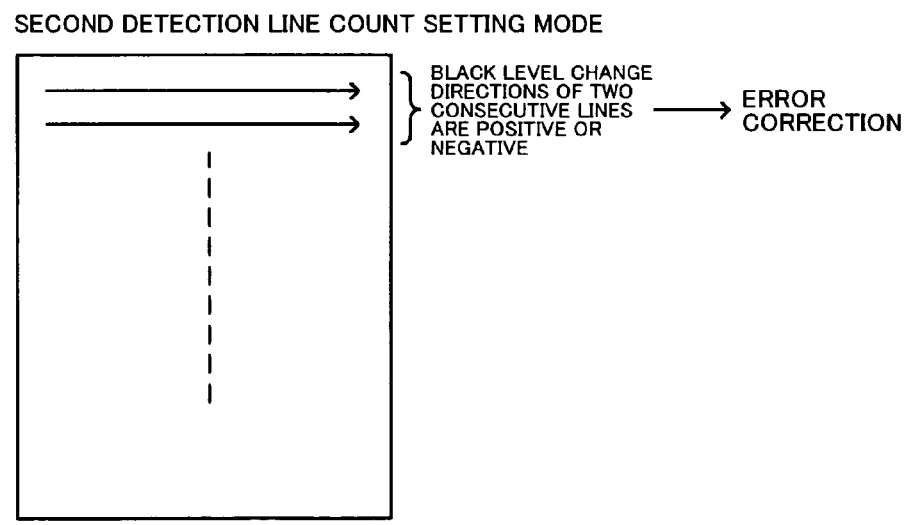

FIGS. 13A and 13B show examples of detection line count setting modes. As shown in FIG. 13A, the black level error correction process is performed corresponding to each line of the image sensor 10 in a first detection line count setting mode.

For example, when a change in the black level (E4 in FIG. 6 and F1 in FIG. 7) has been detected in the black level monitor period (G3 in FIG. 8) corresponding to the first line, the black level error correction process (FIG. 10) is performed. The level of the image signal based on the black level of which the error has been corrected is calculated in the effective pixel output period (G2 in FIG. 8) corresponding to the first line. Specifically, the differential voltage between the level of the image signal and the black level of which the error has been corrected is subjected to A/D conversion.

Likewise, when a change in the black level has been detected in the black level monitor period corresponding to the second line, the black level error correction process is performed. The level of the image signal based on the black level of which the error has been corrected is calculated in the effective pixel output period corresponding to the second line. This also applies the third line, the fourth line, and the like.

In a second detection line count setting mode, the black level error correction process is performed when a change in the black level in the same direction has been detected corresponding to a plurality of consecutive lines of the image sensor 10, as shown in FIG. 13B.

For example, the black level error correction process is performed when the change direction of the black level corresponding to the first line is a positive direction and the change direction of the black level corresponding to the second line is also a positive direction. The level of the image signal based on the black level of which the error has been corrected is calculated in the effective pixel output period corresponding to the second line. In this case, the black level error correction process is performed when the change direction of the black level corresponding to the second line is a negative direction.

The black level error correction process is performed when the change direction of the black level corresponding to the first line is a negative direction and the change direction of the black level corresponding to the second line is also a negative direction. The level of the image signal based on the black level of which the error has been corrected is calculated in the effective pixel output period corresponding to the second line. In this case, the black level error correction process is performed when the change direction of the black level corresponding to the second line is a positive direction. Note that the expression "the change direction is a positive direction" refers to the case where the value obtained by subtracting the black level target value from the A/D-converted value is positive, and the expression "the change direction is a negative direction" refers to the case where the value obtained by subtracting the black level target value from the A/D-converted value is negative.

For example, when the black level has changed due to noise or the like, an oscillation mode phenomenon may occur due to error correction if the error is immediately corrected. In this case, such an oscillation mode phenomenon can be suppressed by setting the black level change detection mode to the second detection line count setting mode shown in FIG. 13B.

In this embodiment, the error correction process is implemented by a simple process merely using subtraction, as shown in FIG. 10. Therefore, the process is terminated when the subtraction result is a negative value when performing the process in the step S5 in FIG. 10 corresponding to the first line, for example. Therefore, the correction process corresponding to the second line is performed in the direction which is the reverse of that of the first line, whereby an oscillation mode phenomenon may occur.

On the other hand, such an oscillation mode phenomenon can be suppressed by setting the black level change detection mode to the second detection line count setting mode shown in FIG. 13B.

In FIG. 13B, the error correction process is performed when the change directions corresponding to two consecutive lines are identical. Note that the error correction process may be performed when the change directions corresponding to three or more consecutive lines are identical, for example.

Figure 14A:
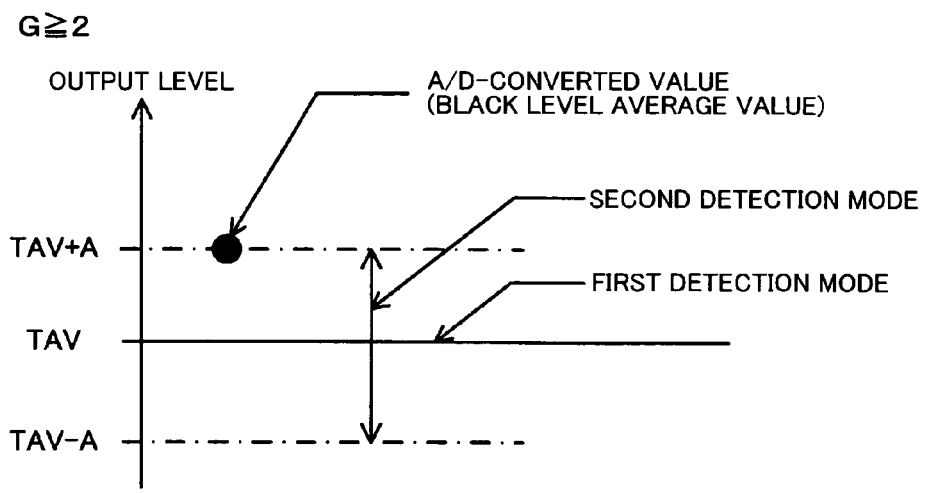
FIGS. 14A and 14B are views illustrative of first and second detection modes.
Figure 14B:
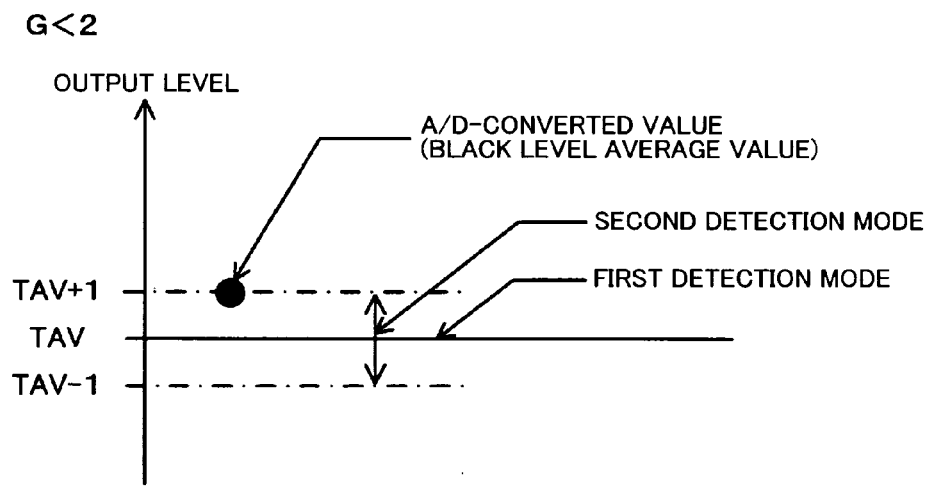

FIGS. 14A and 14B show examples of setting modes based on a detection range. In FIG. 14A, the A/D-converted value (average value) is larger than the black level target value TAV, for example. In a first detection mode, the black level error correction process is performed when the A/D-converted value in the black level monitor period has changed from the black level target value TAV. Specifically, when the A/D-converted value has changed to a value differing from the black level target value TAV, the error is corrected.

In a second detection mode, the black level error correction process is performed when the A/D-converted value is outside the detection range between TAV+A and TAV−A. The value TAV+A is the upper limit value of the detection range obtained by adding the correction amount A to the black level target value TAV. The value TAV−A is the lower limit value of the detection range obtained by subtracting the correction amount A from the black level target value TAV.

In the second detection mode, the black level error correction process is performed when the A/D-converted value is outside the detection range between TAV+A and TAV−A, and is not performed when the A/D-converted value is within the detection range between TAV+A and TAV−A. In other words, the detection range between TAV+A and TAV−A is set to be an error correction dead zone.

The correction amount A is set at two when the gain G is smaller than two, as described with reference to FIG. 12. Therefore, the detection range is set between TAV+1 and TAV−1 when the gain G is smaller than two, as shown in FIG. 14B.

According to the second detection mode, when the black level has changed due to noise or the like, the error correction process is not performed when the change in the black level is within the detection range. Therefore, an oscillation mode phenomenon due to error correction can be suppressed.

In this embodiment, since the error correction process is implemented by a simple process merely using subtraction, as shown in FIG. 10, the process is terminated when the subtraction result is a negative value when performing the process in the step S5 in FIG. 10. Therefore, the correction process corresponding to the subsequent line is performed in the reverse direction, whereby an oscillation mode phenomenon may occur.

On the other hand, such an oscillation mode phenomenon can be suppressed by setting the black level change detection mode to the second detection mode shown in FIGS. 14A and 14B.

8. Black Level Correction Mode

In this embodiment, various modes are provided as a black level correction mode. The black level correction mode can be switched between these modes by changing a value set in a register provided in the analog front-end circuit.

Figure 15A:
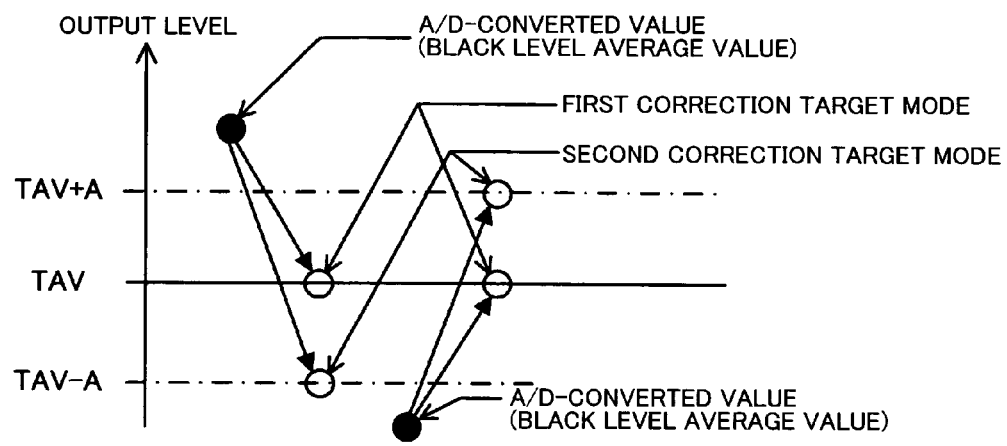
FIGS. 15A and 15B are views illustrative of first and second correction target modes and an overcorrection mode.

FIG. 15A shows an example of a correction target setting mode. In a first correction target mode, the black level error correction process is performed which causes the A/D-converted value to coincide with the black level target value TAV, for example. Specifically, the error correction process of which the correction target is the black level target value TAV is performed.

In a second correction target mode, the black level error correction process is performed which causes the A/D-converted value to coincide with the upper limit value TAV+A obtained by adding the correction amount A to the black level target value TAV or the lower limit value TAV−A obtained by subtracting the correction amount A from the black level target value TAV.

For example, when the A/D-converted value (average value) is larger than the black level target value TAV, the error correction process which causes the A/D-converted value to coincide with the lower limit value TAV−A is performed. When the A/D-converted value is smaller than the black level target value TAV, the error correction process which causes the A/D-converted value to coincide with the upper limit value TAV+A is performed.

For example, when the black level has changed for a specific reason, the black level change direction may necessarily be a specific direction (positive direction or negative direction). In this case, since the error correction process which cancels the change in the black level in the specific direction is performed in advance by setting the black level correction mode to the second correction target mode, a high-speed error correction can be implemented.

Figure 15B:
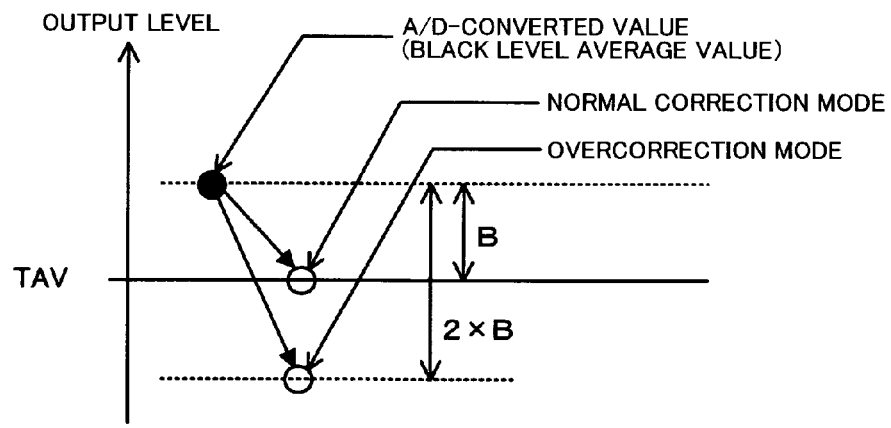

FIG. 15B shows an example of an overcorrection setting mode. In a normal correction mode, the error correction process is performed which changes the offset adjustment value set in the offset adjustment register 24 by the adjustment amount B, for example. When the adjustment amount B is one, for example, the offset adjustment value is corrected by 1 LSB.

In an overcorrection mode, an overcorrection error correction process is performed which changes the offset adjustment value by an amount twice (m times in a broad sense; m is an integer equal to or larger than two) the adjustment amount B. When the adjustment amount B is one, for example, the offset adjustment value is corrected by 2×1 LSB.

Since the error correction process which cancels a change in the black level in a specific direction is performed in advance by setting the black level correction mode to the overcorrection mode, a high-speed error correction can be implemented.

9. Analog Processing Circuit

Figure 16:
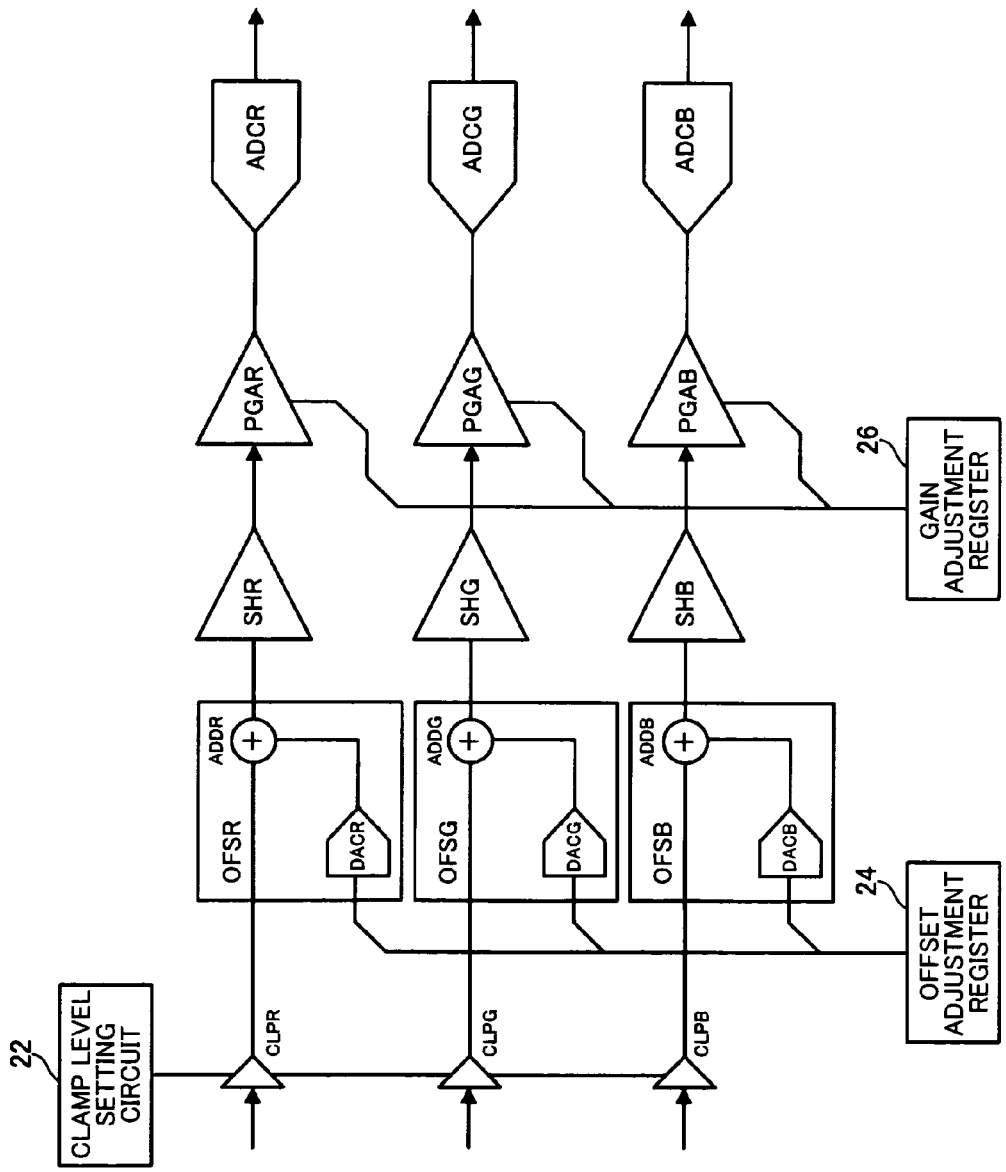
FIG. 16 shows a configuration example of an analog processing circuit.

FIG. 16 shows a configuration example of the analog processing circuit 20. Note that the configuration of the analog processing circuit 20 is not limited to the configuration shown in FIG. 16. Various modifications may be made such as omitting some elements.

The analog processing circuit 20 includes R, G, and B clamp circuits CLPR, CLPG, and CLPB. The clamping circuits CLPR, CLPG, and CLPB clamp the levels of R, G, and B image signals at a clamp level set in a clamp level setting circuit 22.

The analog processing circuit 20 includes R, G, and B offset adjustment circuits OFSR, OFSG, and OFSB. The offset adjustment circuits OFSB, OFSR, and OFSG respectively include R, G, and B D/A converters DACR, DACG, and DACB and analog adder circuits ADDR, ADDG, and ADDB. The offset adjustment circuits OFSB, OFSR, and OFSG perform an offset adjustment based on offset adjustment data set in the offset adjustment register 24.

The analog processing circuit 20 includes R, G, and B sample-hold circuits SHR, SHG, and SHB. The sample-hold circuits SHR, SHG, and SHB sample and hold the image signals subjected to an offset adjustment.

The analog processing circuit 20 includes R, G, and B gain adjustment amplifiers PGAR, PGAG, and PGAB. The gain adjustment amplifiers PGAR, PGAG, and PGAB perform a gain adjustment based on gain adjustment data set in the gain adjustment register 26. The image signals subjected to a gain adjustment output by the gain control amplifiers PGAR, PGAG, and PGAB are input to the R, G, and B A/D converters ADCR, ADCG, and ADCB and subjected to A/D conversion. Digital image data obtained by A/D conversion may be output to the outside using LVDS differential signals or the like.

10. Electronic Instrument

Figure 17:
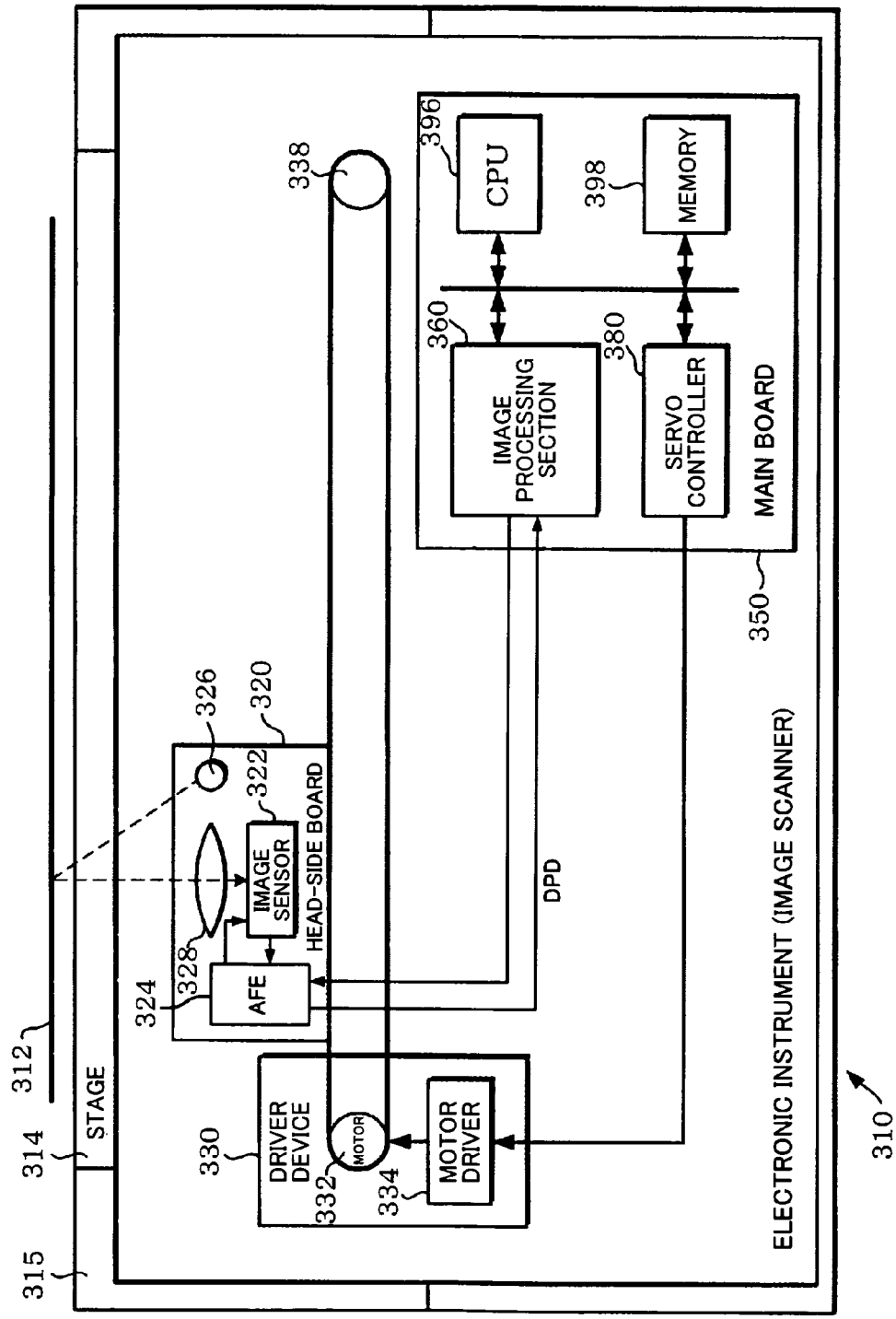
FIG. 17 shows a configuration example of an electronic instrument.

FIG. 17 shows a configuration example of an electronic instrument 310 including an analog front-end circuit (AFE) 324 according to the above embodiment. Note that the electronic instrument 310 need not necessarily include all elements shown in FIG. 17. Various modifications may be made such as omitting some of the elements.

The electronic instrument 310 (e.g., flat-bed image scanner) includes a stage 314 on which a reading target 312 (e.g., document) is placed, and a frame 315 (e.g., support member or housing) which supports the stage 314. The rectangular stage 314 is formed of an optically transparent material such as glass. The reading target 312 is placed on the top of the optically transparent stage 314, for example.

The electronic instrument 310 includes a head-side board 320 (carriage) provided with an image sensor 322 and the analog front-end circuit 324. As the image sensor 322, a charge coupled device (CCD), a contact image sensor (CIS), a bucket brigade device (BBD), or the like may be used. The head-side board 320 is also provided with a light source 326 which illuminates the reading target 312 (document), and an optical system (optical head) such as a lens 328 (condensing section) which condenses light from the light source 326 reflected by the reading target 312 onto the image sensor 322.

The electronic instrument 310 includes a driver device 330 (drive mechanism) which moves the head-side board 320. The driver device 330 includes a motor 332 (power source) and a motor driver 334 which drives the motor 332. The image sensor 322 is disposed so that its longitudinal direction coincides with the main scan direction. A drive belt supported by a pulley 338 on the other side is driven by the motor 332 so that the head-side board 320 secured on the drive belt moves in a sub-scan direction (direction perpendicular to the main scan direction). Note that various modifications may be made as to the method of moving the head-side board 320.

The electronic instrument 310 includes a main board 350. The main board 350 controls each block of the electronic instrument 310. Specifically, the main board 350 controls an image data acquisition process, a servomechanism for the head-side board 320, the analog front-end circuit 324, and the like.

The main board 350 includes an image processing section 360. The image processing section 360 processes image data acquired by the analog front-end circuit 324. The main board 50 includes a servo controller 380. The servo controller 380 performs servo control (feedback control) of the driver device 330 (motor 32) which drives (moves) the head-side board 320. The main board 350 includes a CPU 396 (processor) and a memory 398 (ROM or RAM). The CPU 396 controls the entire main board 350, and exchanges information with the outside. The memory 398 stores a program and various types of data, and functions as a work area for the image processing section 360, the servo controller 380, and the CPU 396.

Although the embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term cited with a different term having a broader meaning or the same meaning at least once in the specification and the drawings can be replaced by the different term in any place in the specification and the drawings. The configurations and the operations of the analog front-end circuit and the electronic instrument are not limited to those described relating to the above embodiments. Various modifications and variations may be made.

What is claimed is:

1. An analog front-end circuit comprising:
an analog processing circuit that receives an analog input image signal from an image sensor, performs a given process on the analog input image signal, and outputs an analog image signal;
an A/D converter that A/D-converts the analog image signal input from the analog processing circuit;
a target register, a black level target value being set in the target register; and
a correction amount register; and
a calculation circuit that monitors an A/D-converted value output from the A/D converter and performs calculations,
the analog processing circuit including:
a clamp circuit that performs a line clamp operation on the analog input image signal from the image sensor;
an offset adjustment circuit that includes an offset adjustment register and performs an offset adjustment on an image signal based on an offset adjustment value set in the offset adjustment register; and
a gain adjustment circuit that includes a gain adjustment register and performs a gain adjustment on an image signal based on a gain adjustment value set in the gain adjustment register,
a correction amount being set in the correction amount register, the correction amount corresponding to a change amount of the A/D-converted value when changing the offset adjustment value set in the offset adjustment register by 1 LSB and changing corresponding to the gain adjustment value set in the gain adjustment register,
the calculation circuit monitoring the A/D-converted value of a black reference pixel after the line clamp operation in a black level monitor period, the black level monitor period being a period after a line clamp period of the clamp circuit but before an effective pixel output period, and performing a black level error correction process relating to the line clamp operation based on the correction amount set in the correction amount register, the A/D-converted value monitored in the black level monitor period, and the black level target value set in the target register.

2. The analog front-end circuit as defined in claim 1,
the calculation circuit repeating a process that calculates a differential value between the A/D-converted value monitored in the black level monitor period and the black level target value and subtracts the correction amount from the differential value until a subtraction result becomes zero or less.

3. The analog front-end circuit as defined in claim 1,
the analog front-end circuit further including an adjustment amount register, an adjustment amount being set in the adjustment amount register, the adjustment amount corresponding to the offset adjustment value that changes the A/D-converted value by one and changing corresponding to the gain adjustment value set in the gain adjustment register,
the calculation circuit performing the black level error correction process based on the adjustment amount set in the adjustment amount register, the correction amount set in the correction amount register, the A/D-converted value monitored in the black level monitor period, and the black level target value set in the target register.

4. The analog front-end circuit as defined in claim 3,
the calculation circuit repeating a process that calculates a differential value between the A/D-converted value monitored in the black level monitor period and the black level target value, changes the offset adjustment value set in the offset adjustment register by the adjustment amount, and subtracts the correction amount from the differential value until a subtraction result becomes zero or less.

5. The analog front-end circuit as defined in claim 4,
the calculation circuit performing an overcorrection error correction process in an overcorrection mode, the overcorrection error correction process changing the offset adjustment value set in the offset adjustment register by an amount m times (m is an integer equal to or larger than two) the adjustment amount.

6. The analog front-end circuit as defined in claim 1,
when a gain G set in the gain adjustment circuit is larger than a given value, the correction amount being set at a value larger than one and the adjustment amount being set at one; and
when the gain G is smaller than the given value, the correction amount being set at one and the adjustment amount being set at a value larger than one.

7. The analog front-end circuit as defined in claim 6,
when a change in voltage when changing the offset adjustment value set in the offset adjustment register by 1 LSB is referred to as VF, the number of bits of the A/D converter is referred to as k, and an A/D conversion range of the A/D converter is referred to as ADR, the correction amount A being set at $[\{VF \times G \times (2^k-1)\}/ADR]$ and the adjustment amount B being set at one when the gain G is larger than the given value, and the correction amount A being set at one and the adjustment amount B being set at $[ADR/\{VF \times G \times (2^k-1)\}]$ when the gain G is smaller than the given value.

8. The analog front-end circuit as defined in claim 1,
the calculation circuit performing the black level error correction process in a first detection mode when the A/D-converted value in the black level monitor period has changed from the black level target value set in the target register, and performing the black level error correction process in a second detection mode when the A/D-converted value in the black level monitor period is outside a detection range between an upper limit value and a lower limit value, the upper limit value being obtained by adding the correction amount to the black level target value, the lower limit value being obtained by subtracting the correction amount from the black level target value.

9. The analog front-end circuit as defined in claim 1,
the calculation circuit performing the black level error correction process that causes the A/D-converted value to coincide with the black level target value set in the target register in a first correction target mode, and performing the black level error correction process that causes the A/D-converted value to coincide with an upper limit value or a lower limit value in a second correction target mode, the upper limit value being obtained by adding the correction amount to the black level target value, the lower limit value being obtained by subtracting the correction amount from the black level target value.

10. The analog front-end circuit as defined in claim 1,
the calculation circuit performing the black level error correction process corresponding to each line of the image sensor in a first detection line count setting mode, and performing the black level error correction process in a second detection line count setting mode when a change in black level in an identical direction has been detected corresponding to a plurality of consecutive lines of the image sensor.

11. An analog front-end circuit comprising:

an analog processing circuit that receives an analog input image signal from an image sensor, performs a given process on the analog input image signal, and outputs an analog image signal;

an A/D converter that A/D-converts the analog image signal input from the analog processing circuit;

a target register, a black level target value being set in the target register; and a calculation circuit that monitors an A/D-converted value output from the A/D converter and performs calculations, the analog processing circuit including:

a clamp circuit that performs a line clamp operation on the analog input image signal from the image sensor; and an offset adjustment circuit that includes an offset adjustment register and performs an offset adjustment on an image signal based on an offset adjustment value set in the offset adjustment register, the calculation circuit monitoring the A/D-converted value of a black reference pixel after the line clamp operation in a black level monitor period, the black level monitor period being a period after a line clamp period of the clamp circuit but before an effective pixel output period, and performing a black level error correction process relating to the line clamp operation by writing an offset adjustment value into the offset adjustment register, the offset adjustment value causing the A/D-converted value to be set at the black level target value set in the target register, and the calculation circuit performing the black level error correction process corresponding to each line of the image sensor in a first detection line count setting mode, and performing the black level error correction process in a second detection line count setting mode when a change in black level in an identical direction has been detected corresponding to a plurality of consecutive lines of the image sensor.

12. The analog front end circuit as defined in claim 11, the analog processing circuit including a gain adjustment circuit that includes a gain adjustment register and performs a gain adjustment on an image signal based on a gain adjustment value set in the gain adjustment register;

the analog front end circuit further including a correction amount register, a correction amount being set in the correction amount register, the correction amount corresponding to a change amount of the A/D converted value when changing the offset adjustment value set in the offset adjustment register by 1 LSB and changing corresponding to the gain adjustment value set in the gain adjustment register; and the calculation circuit performing the black level error correction process based on the correction amount set in the correction amount register, the A/D converted value monitored in the black level monitor period, and the black level target value set in the target register.

13. An electronic instrument comprising:

the analog front-end circuit as defined in claim 1; and an image sensor.

* * * * *